United States Patent
Meyer et al.

(10) Patent No.: US 9,299,861 B2
(45) Date of Patent: Mar. 29, 2016

(54) CELL-TO-GRID REDUNDANDT PHOTOVOLTAIC SYSTEM

(71) Applicant: tenKsolar, Inc., Minneapolis, MN (US)

(72) Inventors: Dallas W. Meyer, Prior Lake, MN (US);
Lowell Berg, Eden Prairie, MN (US);
John Novotny, Eden Prairie, MN (US);
Shady Gross, Bloomington, MN (US);
Forrest C. Meyer, Eden Prairie, MN (US)

(73) Assignee: TENKSOLAR, INC., Minneapolis, MN (US)

( * ) Notice: Subject to any disclaimer, the term of this patent is extended or adjusted under 35 U.S.C. 154(b) by 613 days.

(21) Appl. No.: 13/664,885

(22) Filed: Oct. 31, 2012

(65) Prior Publication Data

US 2013/0062956 A1 Mar. 14, 2013

Related U.S. Application Data

(63) Continuation-in-part of application No. 12/815,913, filed on Jun. 15, 2010, now Pat. No. 8,563,847, and a continuation-in-part of application No. 13/207,164, filed on Aug. 10, 2011, now Pat. No. 8,829,330.

(Continued)

(51) Int. Cl.
*H01L 31/02* (2006.01)
*H02S 50/10* (2014.01)
(Continued)

(52) U.S. Cl.
CPC ........ *H01L 31/02008* (2013.01); *H01L 31/048* (2013.01); *H01L 31/0504* (2013.01);
(Continued)

(58) Field of Classification Search
CPC .................... H02S 40/30–40/38; H02S 50/10; H01L 31/02008
USPC .............................................. 136/244; 307/82
See application file for complete search history.

(56) References Cited

U.S. PATENT DOCUMENTS 3,094,439 A    6/1963   Mann et al.
3,350,234 A    10/1967  Ule
(Continued)

FOREIGN PATENT DOCUMENTS

CN    1388636    1/2003
CN    1628390    6/2005
(Continued)

OTHER PUBLICATIONS

Chinese Office Action in Chinese Application No. 200980109824.X, dated Aug. 24, 2011, 10 pgs.
(Continued)

*Primary Examiner* — Allison Bourke
(74) *Attorney, Agent, or Firm* — Maschoff Brennan

(57) ABSTRACT

In an embodiment, a photovoltaic system includes multiple photovoltaic modules and a module-to-module bus. Each photovoltaic module defines a first end and a second end opposite the first end. Each photovoltaic module includes multiple photovoltaic cells and multiple converters. Energy generated by each photovoltaic cell has multiple paths through the photovoltaic cells to the second end. The converters are electrically coupled to the photovoltaic cells at the second end such that energy generated by each photovoltaic cell is receivable at any of the converters. The module-to-module bus is electrically coupled to each of the photovoltaic modules. The module-to-module bus has an output. Energy generated by each photovoltaic module is receivable at the output independent of any other of the photovoltaic modules.

30 Claims, 13 Drawing Sheets

Related U.S. Application Data

(60) Provisional application No. 61/392,862, filed on Oct. 13, 2010, provisional application No. 61/553,822, filed on Oct. 31, 2011, provisional application No. 61/554,710, filed on Nov. 2, 2011, provisional application No. 61/585,720, filed on Jan. 12, 2012, provisional application No. 61/590,925, filed on Jan. 26, 2012, provisional application No. 61/620,566, filed on Apr. 5, 2012, provisional application No. 61/694,548, filed on Aug. 29, 2012, provisional application No. 61/694,559, filed on Aug. 29, 2012, provisional application No. 61/699,701, filed on Sep. 11, 2012.

(51) Int. Cl.
*H01L 31/048* (2014.01)
*H01L 31/05* (2014.01)
*H02S 40/32* (2014.01)
*H02S 40/34* (2014.01)
*H02S 40/36* (2014.01)
*G01R 31/40* (2014.01)
*H02M 7/00* (2006.01)
*H01R 4/24* (2006.01)
*H02J 3/38* (2006.01)

(52) U.S. Cl.
CPC ............... *H02S40/32* (2014.12); *H02S 40/34* (2014.12); *H02S 40/36* (2014.12); *H02S 50/00* (2013.01); *H02S 50/10* (2014.12); *H01R 4/2475* (2013.01); *H02J 3/383* (2013.01); *H02M 7/003* (2013.01); *Y02E 10/563* (2013.01); *Y10T 307/707* (2015.04)

(56) References Cited

U.S. PATENT DOCUMENTS

| | | |
|---|---|---|
| 3,419,434 A | 12/1968 | Colehower |
| 3,833,426 A | 9/1974 | Mesch |
| 4,002,160 A | 1/1977 | Mather |
| 4,020,827 A | 5/1977 | Broberg |
| 4,033,327 A | 7/1977 | Pei |
| 4,120,282 A | 10/1978 | Espy |
| 4,154,998 A | 5/1979 | Luft et al. |
| 4,158,768 A | 6/1979 | Lavelli |
| 4,212,293 A | 7/1980 | Nugent |
| 4,227,298 A | 10/1980 | Keeling |
| 4,309,334 A | 1/1982 | Valitsky |
| 4,316,448 A | 2/1982 | Dodge |
| 4,321,416 A | 3/1982 | Tennant |
| 4,369,498 A | 1/1983 | Schulte |
| 4,410,757 A | 10/1983 | Stamminger et al. |
| 4,461,922 A | 7/1984 | Gay et al. |
| 4,481,378 A | 11/1984 | Lesk |
| 4,514,579 A | 4/1985 | Hanak |
| 4,604,494 A | 8/1986 | Shepard, Jr. |
| 4,611,090 A | 9/1986 | Catella |
| 4,617,421 A | 10/1986 | Nath |
| 4,695,788 A | 9/1987 | Marshall |
| 4,716,258 A | 12/1987 | Murtha |
| 4,747,699 A | 5/1988 | Kobayashi et al. |
| 4,755,921 A | 7/1988 | Nelson |
| 4,773,944 A | 9/1988 | Nath |
| 4,854,974 A | 8/1989 | Carlson |
| 4,933,022 A | 6/1990 | Swanson |
| 4,964,713 A | 10/1990 | Goetzberger |
| 4,966,631 A | 10/1990 | Matlin |
| 5,013,141 A | 5/1991 | Sakata |
| 5,021,099 A | 6/1991 | Kim |
| 5,048,194 A | 9/1991 | McMurtry |
| 5,096,505 A | 3/1992 | Fraas et al. |
| 5,205,739 A | 4/1993 | Malo |
| 5,246,782 A | 9/1993 | Kennedy |
| 5,268,037 A | 12/1993 | Glatfelter |
| 5,270,636 A | 12/1993 | Lafferty |
| 5,288,337 A | 2/1994 | Mitchell |
| 5,344,497 A | 9/1994 | Fraas |
| 5,374,317 A | 12/1994 | Lamb |
| 5,457,057 A | 10/1995 | Nath |
| 5,468,988 A | 11/1995 | Glatfelter |
| 5,478,402 A | 12/1995 | Hanoka |
| 5,491,040 A | 2/1996 | Chaloner-Gill |
| 5,493,096 A | 2/1996 | Koh |
| 5,505,789 A | 4/1996 | Fraas |
| 5,513,075 A | 4/1996 | Capper |
| 5,538,563 A | 7/1996 | Finkl |
| 5,571,338 A | 11/1996 | Kadonome |
| 5,593,901 A | 1/1997 | Oswald |
| 5,719,758 A | 2/1998 | Nakata |
| 5,735,966 A | 4/1998 | Luch |
| 5,745,355 A | 4/1998 | Tracy et al. |
| 5,801,519 A | 9/1998 | Midya |
| 5,896,281 A | 4/1999 | Bingley |
| 5,910,738 A | 6/1999 | Shinohe |
| 5,982,157 A | 11/1999 | Wattenhofer |
| 5,990,413 A | 11/1999 | Ortabasi |
| 5,994,641 A | 11/1999 | Kardauskas |
| 6,011,215 A | 1/2000 | Glatfelter |
| 6,017,002 A | 1/2000 | Burke et al. |
| 6,043,425 A | 3/2000 | Assad |
| 6,077,722 A | 6/2000 | Jansen |
| 6,111,189 A | 8/2000 | Garvison |
| 6,111,454 A | 8/2000 | Shinohe |
| 6,111,767 A | 8/2000 | Handleman |
| 6,134,784 A | 10/2000 | Carrie |
| 6,177,627 B1 | 1/2001 | Murphy |
| 6,188,012 B1 | 2/2001 | Ralph |
| 6,201,180 B1 | 3/2001 | Meyer |
| 6,281,485 B1 | 8/2001 | Siri |
| 6,288,325 B1 | 9/2001 | Jansen |
| 6,294,723 B2 | 9/2001 | Uematsu |
| 6,331,208 B1 | 12/2001 | Nishida |
| 6,337,436 B1 | 1/2002 | Ganz |
| 6,339,538 B1 | 1/2002 | Handleman |
| 6,351,130 B1 | 2/2002 | Preiser |
| 6,462,265 B1 | 10/2002 | Sasaoka et al. |
| 6,465,724 B1 | 10/2002 | Garvison |
| 6,479,744 B1 | 11/2002 | Tsuzuki et al. |
| 6,515,215 B1 | 2/2003 | Mimura |
| 6,528,716 B2 | 3/2003 | Collette |
| 6,706,963 B2 | 3/2004 | Gaudiana |
| 6,739,692 B2 | 5/2004 | Unosawa |
| 6,750,391 B2 | 6/2004 | Bower |
| 6,753,692 B2 | 6/2004 | Toyomura |
| 6,803,513 B2 | 10/2004 | Beernink |
| 6,858,461 B2 | 2/2005 | Oswald |
| 6,870,087 B1 | 3/2005 | Gallagher |
| 6,882,063 B2 | 4/2005 | Droppo |
| 6,903,261 B2 | 6/2005 | Habraken |
| 6,966,184 B2 | 11/2005 | Toyomura |
| 6,992,256 B1 | 1/2006 | Wiley |
| 7,009,412 B2 | 3/2006 | Chong |
| 7,094,441 B2 | 8/2006 | Chittibabu |
| 7,099,169 B2 | 8/2006 | West et al. |
| 7,138,730 B2 | 11/2006 | Lai |
| 7,205,626 B1 | 4/2007 | Nakata |
| 7,259,322 B2 | 8/2007 | Gronet |
| 7,276,724 B2 | 10/2007 | Sheats |
| 7,297,865 B2 | 11/2007 | Terao |
| 7,301,095 B2 | 11/2007 | Murphy |
| 7,336,004 B2 | 2/2008 | Lai |
| 7,339,108 B2 | 3/2008 | Tur |
| 7,342,171 B2 | 3/2008 | Khouri |
| 7,388,146 B2 | 6/2008 | Fraas |
| 7,432,438 B2 | 10/2008 | Rubin et al. |
| 7,498,508 B2 | 3/2009 | Rubin et al. |
| 7,997,938 B2 | 8/2011 | Costello et al. |
| 8,013,239 B2 | 9/2011 | Rubin et al. |
| 8,138,631 B2 | 3/2012 | Allen et al. |
| 8,212,139 B2 | 7/2012 | Meyer |
| 8,563,847 B2 | 10/2013 | Meyer |
| 8,581,608 B2 | 11/2013 | Shizuya et al. |
| 8,748,727 B2 | 6/2014 | Meyer |

(56) References Cited

U.S. PATENT DOCUMENTS

| | | |
|---|---|---|
| 8,828,778 B2 | 9/2014 | Meyer |
| 8,829,330 B2 | 9/2014 | Meyer |
| 8,933,320 B2 | 1/2015 | Meyer |
| 2001/0008144 A1 | 7/2001 | Uematsu |
| 2002/0038667 A1* | 4/2002 | Kondo ............ H02S 40/32 136/244 |
| 2002/0179140 A1 | 12/2002 | Toyomura |
| 2003/0047208 A1 | 3/2003 | Glenn et al. |
| 2003/0121228 A1 | 7/2003 | Stoehr |
| 2003/0121542 A1 | 7/2003 | Harneit et al. |
| 2003/0201007 A1 | 10/2003 | Fraas |
| 2004/0016454 A1 | 1/2004 | Murphy et al. |
| 2004/0055594 A1 | 3/2004 | Hochberg |
| 2004/0089337 A1 | 5/2004 | Chou |
| 2004/0261834 A1 | 12/2004 | Basore |
| 2004/0261955 A1 | 12/2004 | Shingleton et al. |
| 2005/0000562 A1 | 1/2005 | Kataoka et al. |
| 2005/0022857 A1 | 2/2005 | Daroczi |
| 2005/0034751 A1 | 2/2005 | Gross |
| 2005/0061360 A1 | 3/2005 | Horioka et al. |
| 2005/0081909 A1 | 4/2005 | Paull |
| 2005/0115176 A1 | 6/2005 | Russell |
| 2005/0121067 A1 | 6/2005 | Toyomura et al. |
| 2005/0133081 A1 | 6/2005 | Amato |
| 2005/0158891 A1 | 7/2005 | Barth |
| 2005/0172995 A1 | 8/2005 | Rohrig |
| 2005/0194939 A1 | 9/2005 | Duff, Jr. |
| 2005/0263179 A1 | 12/2005 | Gaudiana |
| 2005/0268959 A1 | 12/2005 | Aschenbrenner |
| 2005/0278076 A1 | 12/2005 | Barbir |
| 2006/0001406 A1 | 1/2006 | Matan |
| 2006/0042681 A1 | 3/2006 | Korman |
| 2006/0054212 A1 | 3/2006 | Fraas |
| 2006/0086384 A1 | 4/2006 | Nakata |
| 2006/0092588 A1 | 5/2006 | Realmuto et al. |
| 2006/0162772 A1 | 7/2006 | Presher, Jr. |
| 2006/0174931 A1 | 8/2006 | Mapes et al. |
| 2006/0174939 A1 | 8/2006 | Matan |
| 2006/0180197 A1 | 8/2006 | Gui |
| 2006/0185716 A1 | 8/2006 | Murozono |
| 2006/0185727 A1 | 8/2006 | Matan |
| 2006/0213548 A1 | 9/2006 | Bachrach |
| 2006/0225777 A1 | 10/2006 | Buechel |
| 2006/0235717 A1 | 10/2006 | Sharma |
| 2006/0261830 A1 | 11/2006 | Taylor |
| 2006/0266407 A1 | 11/2006 | Lichy |
| 2007/0035864 A1 | 2/2007 | Vasylyev |
| 2007/0056626 A1 | 3/2007 | Funcell |
| 2007/0068567 A1 | 3/2007 | Rubin et al. |
| 2007/0079861 A1 | 4/2007 | Morali |
| 2007/0095384 A1 | 5/2007 | Farquhar |
| 2007/0103108 A1 | 5/2007 | Capp |
| 2007/0113885 A1 | 5/2007 | Chan |
| 2007/0124619 A1 | 5/2007 | Mizukami |
| 2007/0125415 A1 | 6/2007 | Sachs |
| 2007/0144577 A1 | 6/2007 | Rubin et al. |
| 2007/0151594 A1 | 7/2007 | Mascolo et al. |
| 2007/0157964 A1 | 7/2007 | Gronet |
| 2007/0179720 A1 | 8/2007 | Becker et al. |
| 2007/0186971 A1 | 8/2007 | Lochun |
| 2007/0193620 A1 | 8/2007 | Hines |
| 2007/0199588 A1 | 8/2007 | Rubin et al. |
| 2007/0215195 A1 | 9/2007 | Buller |
| 2007/0235077 A1 | 10/2007 | Nagata |
| 2007/0240755 A1 | 10/2007 | Lichy |
| 2007/0251569 A1 | 11/2007 | Shan |
| 2007/0261731 A1 | 11/2007 | Abe |
| 2007/0266672 A1 | 11/2007 | Bateman |
| 2007/0272295 A1 | 11/2007 | Rubin et al. |
| 2007/0273338 A1 | 11/2007 | West |
| 2007/0295381 A1 | 12/2007 | Fujii |
| 2008/0000516 A1 | 1/2008 | Shifman |
| 2008/0029149 A1 | 2/2008 | Simon |
| 2008/0029152 A1 | 2/2008 | Milshtein |
| 2008/0037141 A1 | 2/2008 | Tom |
| 2008/0047003 A1 | 2/2008 | Wong et al. |
| 2008/0092944 A1 | 4/2008 | Rubin et al. |
| 2008/0111517 A1* | 5/2008 | Pfeifer ............ H02J 7/0065 320/101 |
| 2008/0122518 A1 | 5/2008 | Besser et al. |
| 2008/0142071 A1 | 6/2008 | Dorn et al. |
| 2008/0163922 A1 | 7/2008 | Horne et al. |
| 2008/0164766 A1 | 7/2008 | Adest et al. |
| 2008/0210286 A1 | 9/2008 | Ball |
| 2008/0236648 A1 | 10/2008 | Klein et al. |
| 2008/0290368 A1 | 11/2008 | Rubin |
| 2008/0298051 A1 | 12/2008 | Chu |
| 2009/0025778 A1 | 1/2009 | Rubin et al. |
| 2009/0121968 A1 | 5/2009 | Okamoto |
| 2009/0151775 A1 | 6/2009 | Pietrzak |
| 2009/0183760 A1 | 7/2009 | Meyer |
| 2009/0183763 A1 | 7/2009 | Meyer |
| 2009/0183764 A1 | 7/2009 | Meyer |
| 2009/0217965 A1 | 9/2009 | Dougal et al. |
| 2009/0242021 A1 | 10/2009 | Petkie et al. |
| 2009/0250093 A1 | 10/2009 | Chen |
| 2009/0296348 A1* | 12/2009 | Russell ............ H02S 40/32 361/702 |
| 2010/0000165 A1 | 1/2010 | Koller |
| 2010/0014738 A1 | 1/2010 | Birnholz et al. |
| 2010/0089390 A1 | 4/2010 | Miros et al. |
| 2010/0101624 A1* | 4/2010 | Fioretti ............ H01L 31/02008 136/244 |
| 2010/0131108 A1 | 5/2010 | Meyer |
| 2010/0175337 A1 | 7/2010 | Mascolo et al. |
| 2010/0206378 A1* | 8/2010 | Erickson, Jr. ..... H01L 31/02021 136/259 |
| 2010/0212720 A1 | 8/2010 | Meyer et al. |
| 2010/0219688 A1 | 9/2010 | Shyu et al. |
| 2010/0253151 A1 | 10/2010 | Gerhardinger et al. |
| 2010/0282293 A1 | 11/2010 | Meyer et al. |
| 2010/0313499 A1 | 12/2010 | Gangemi |
| 2010/0313933 A1 | 12/2010 | Xu |
| 2011/0018353 A1 | 1/2011 | Yu |
| 2011/0039992 A1 | 2/2011 | Irie |
| 2011/0067748 A1 | 3/2011 | Pfeiffer |
| 2011/0175662 A1* | 7/2011 | Said El-Barbari ........ H01L 31/02021 327/319 |
| 2011/0199040 A1* | 8/2011 | English ............ H02J 7/0073 320/101 |
| 2011/0241431 A1 | 10/2011 | Chen et al. |
| 2011/0301772 A1 | 12/2011 | Zuercher et al. |
| 2012/0042588 A1 | 2/2012 | Erickson, Jr. |
| 2012/0204935 A1 | 8/2012 | Meyer et al. |
| 2012/0215372 A1* | 8/2012 | Kernahan ........ H01L 31/02021 700/298 |
| 2012/0234374 A1 | 9/2012 | Meyer |
| 2012/0319494 A1 | 12/2012 | Ecrabey et al. |
| 2013/0312812 A1 | 11/2013 | Meyer |
| 2014/0035373 A1 | 2/2014 | Meyer |
| 2014/0174535 A1 | 6/2014 | Meyer |
| 2014/0360561 A1 | 12/2014 | Meyer |
| 2015/0047689 A1 | 2/2015 | Meyer |

FOREIGN PATENT DOCUMENTS

| | | |
|---|---|---|
| CN | 101336476 | 12/2008 |
| DE | 3708548 | 9/1988 |
| DE | 4027325 | 4/1992 |
| DE | 20314372 | 12/2003 |
| DE | 102004001248 | 1/2005 |
| DE | 202006020180 | 12/2007 |
| EP | 1724842 | 11/2006 |
| EP | 1744372 | 1/2007 |
| EP | 2172980 | 4/2010 |
| EP | 2251941 | 11/2010 |
| GB | 2331530 | 5/1999 |
| JP | 60-141152 | 9/1985 |
| JP | 02-025079 | 1/1990 |
| JP | 09-045946 | 2/1997 |
| JP | 10-69321 | 3/1998 |
| JP | 10-69321 A | 3/1998 |
| JP | 10-245935 | 9/1998 |

(56) References Cited

FOREIGN PATENT DOCUMENTS

| JP | 10-281562 | 10/1998 |
|---|---|---|
| JP | 11-041832 | 2/1999 |
| JP | 11-103538 | 4/1999 |
| JP | 2000-114571 | 4/2000 |
| JP | 2000-213255 | 8/2000 |
| JP | 2000-357812 | 12/2000 |
| JP | 2000-357812 A | 12/2000 |
| JP | 2001-268891 | 9/2001 |
| JP | 2002-073184 | 3/2002 |
| JP | 2002-305318 | 10/2002 |
| JP | 2002-314112 | 10/2002 |
| JP | 2003-026455 | 1/2003 |
| JP | 2003-282918 | 10/2003 |
| JP | 2006-040931 | 2/2006 |
| JP | 2006-302147 | 11/2006 |
| JP | 2006-302147 A | 11/2006 |
| JP | 2007-234795 | 9/2007 |
| JP | 2007-294630 | 11/2007 |
| JP | 2009-503870 | 1/2009 |
| JP | 2009-032945 | 2/2009 |
| JP | 2009-032945 A | 2/2009 |
| JP | 2009-545877 | 12/2009 |
| JP | 2010-263027 A | 11/2010 |
| JP | 2011-2991 | 1/2011 |
| JP | 2011-002991 A | 1/2011 |
| JP | 2011-129626 | 6/2011 |
| KR | 10-1998-0087002 | 12/1998 |
| KR | 10-2007-0104300 | 10/2007 |
| KR | 10-2007-0107318 | 11/2007 |
| KR | 10-2010-0129721 A | 12/2010 |
| TW | 201042770 | 12/2010 |
| TW | 201106490 | 12/2011 |
| WO | WO 02/35613 | 2/2002 |
| WO | WO 2004/021455 | 3/2004 |
| WO | WO 2007/071064 | 6/2007 |
| WO | WO 2007/095757 | 8/2007 |
| WO | WO 2007/137407 | 12/2007 |
| WO | WO 2008/016453 | 2/2008 |
| WO | WO 2008/028677 | 3/2008 |
| WO | WO 2008/042828 | 4/2008 |
| WO | WO 2008/046201 | 4/2008 |
| WO | WO 2008/141415 | 11/2008 |
| WO | WO 2009/012567 | 1/2009 |
| WO | WO 2009/076740 | 6/2009 |
| WO | WO 2009/092110 | 7/2009 |
| WO | WO 2009/092111 | 7/2009 |
| WO | WO 2010/012062 | 2/2010 |
| WO | WO 2010/037393 | 4/2010 |
| WO | 2010/068226 A1 | 6/2010 |
| WO | WO 2010/096833 | 8/2010 |
| WO | WO 2010/148009 | 12/2010 |
| WO | WO 2011/011855 | 2/2011 |
| WO | WO 2011/109741 | 9/2011 |

OTHER PUBLICATIONS

Chinese Office Action in Chinese Application No. 201080017252.5, dated Aug. 13, 2013, 19 pgs.
Chinese Office Action in Chinese Application No. 201080017252.5, dated Apr. 28, 2014, 12 pgs.
Chinese Office Action in Chinese Application No. 201080017252.5, dated Nov. 14, 2014, 10 pgs.
Chinese Office Action in Chinese Application No. 201080036349.0, dated Jan. 6, 2014, 15 pgs.
Chinese Office Action in Chinese Application No. 201080036349.0, dated Jun. 6, 2014, 9 pgs.
European Search Report in European Application No. 09702762.7, dated Jun. 13, 2013, 2 pgs.
European Search Report in European Application No. 10744485.3, dated Jan. 17, 2014, 4 pgs.
European Search Report in European Application No. 10790069.8, dated May 2, 2013, 10 pgs.
European Office Action in European Application No. 10790069.8, dated Sep. 9, 2014, 5 pgs.
European Search Report in European Application No. 12846494.8, dated Dec. 18, 2014, 7 pgs.
Japanese Office Action in Japanese Application No. 2011-551303, dated Feb. 19, 2013, 3 pgs.
Japanese Office Action in Japanese Application No. 2012-516209, dated Apr. 30, 2013, 3 pgs.
Japanese Office Action in Japanese Application No. 2012-516209, dated Dec. 17, 2013, 5 pgs.
Japanese Office Action in Japanese Application No. 2012-516209, dated Jun. 24, 2014, 12 pgs.
Japanese Office Action in Japanese Application No. 2012-516209, dated Oct. 28, 2014, 8 pgs.
International Search Report and Written Opinion, as issued in connection with International Patent Application No. PCT/US2009/031594, mailed Jun. 25, 2009, 7 pgs.
International Search Report and Written Opinion, as issued in connection with International Patent Application No. PCT/US2009/031596, mailed Sep. 8, 2009, 8 pgs.
International Search Report and Written Opinion, as issued in connection with International Patent Application No. PCT/US2009/031597, mailed Sep. 29, 2009, 7 pgs.
International Search Report and Written Opinion, as issued in connection with International Patent Application No. PCT/US2010/025108, mailed Sep. 27, 2010, 9 pgs.
International Search Report and Written Opinion, as issued in connection with International Patent Application No. PCT/US2010/038702, mailed Jan. 5, 2011, 7 pgs.
International Preliminary Report, as issued in connection with International Patent Application No. PCT/US2010/038702, mailed Dec. 29, 2011, 2 pgs.
International Search Report and Written Opinion, as issued in connection with International Patent Application No. PCT/US2010/061864, mailed Aug. 31, 2011, 7 pgs.
International Search Report and Written Opinion, as issued in connection with International Patent Application No. PCT/US2011/047291, mailed Mar. 19, 2012, 9 pgs.
International Search Report and Written Opinion, as issued in connection with International Patent Application No. PCT/US2013/062747, mailed Jan. 28, 2014, 14 pgs.
International Search Report and Written Opinion, as issued in connection with International Patent Application No. PCT/US2014/052166, mailed Nov. 26, 2014, 12 pgs.
Solatron Techonologies, Wiring Solar Modules and Batteries, <http://web.archive.org/web/20030206212224/http://partsonsale.com/learnwiring.htm>, web archived May 9, 2008, 6 pgs.
Zeghbroeck, Bart V., Ellipsometer Data Table, http://ece-www.colorado.edu/~bart/book/ellipstb.htm, 1997, 2 pgs.
US Restriction Requirement in U.S. Appl. No. 12/357,268, dated Nov. 29, 2011, 9 pgs.
US Restriction Requirement in U.S. Appl. No. 12/357,268, dated Feb. 3, 2012, 7 pgs.
US Office Action in U.S. Appl. No. 12/357,268, dated Aug. 2, 2012, 27 pgs.
US Office Action in U.S. Appl. No. 12/357,268, dated Nov. 21, 2012, 22 pgs.
US Notice of Allowance in U.S. Appl. No. 12/357,268, dated Mar. 11, 2014, 12 pgs.
US Restriction Requirement in U.S. Appl. No. 12/684,595, dated Jan. 9, 2012, 11 pgs.
US Notice of Allowance in U.S. Appl. No. 12/684,595, dated Mar. 16, 2012, 12 pgs.
US Restriction Requirement in U.S. Appl. No. 13/485,210, dated Jan. 15, 2014, 5 pgs.
US Notice of Allowance in U.S. Appl. No. 13/485,210, dated May 29, 2014, 13 pgs.
US Restriction Requirement in U.S. Appl. No. 12/357,260, dated Aug. 2, 2012, 5 pgs.
US Office Action in U.S. Appl. No. 12/357,260, dated Feb. 5, 2013, 17 pgs.
US Office Action in U.S. Appl. No. 12/357,260, dated May 23, 2013, 23 pgs.
US Office Action in U.S. Appl. No. 12/357,260, dated Apr. 22, 2014, 26 pgs.

(56) References Cited

OTHER PUBLICATIONS

US Notice of Allowance in U.S. Appl. No. 12/357,260, dated Sep. 4, 2014, 8 pgs.
US Restriction Requirement in U.S. Appl. No. 12/357,277, dated Nov. 10, 2011, 7 pgs.
US Office Action in U.S. Appl. No. 12/357,277, dated Jan. 26, 2012, 11 pgs.
US Office Action in U.S. Appl. No. 12/357,277, dated Jul. 19, 2012, 12 pgs.
US Restriction Requirement in U.S. Appl. No. 12/711,040, dated Jun. 18, 2012, 7 pgs.
US Office Action in U.S. Appl. No. 12/711,040, dated Nov. 26, 2012, 29 pgs.
US Office Action in U.S. Appl. No. 12/711,040, dated Jul. 5, 2013, 35 pgs.
US Restriction Requirement in U.S. Appl. No. 12/815,913, dated May 29, 2012, 6 pgs.
US Office Action in U.S. Appl. No. 12/815,913, dated Oct. 5, 2012, 19 pgs.
US Notice of Allowance in U.S. Appl. No. 12/815,913, dated Sep. 3, 2013, 11 pgs.
US Restriction Requirement in U.S. Appl. No. 13/207,164, dated Sep. 28, 2012, 7 pgs.
US Office Action in U.S. Appl. No. 13/207,164, dated Feb. 14, 2013, 20 pgs.
US Office Action in U.S. Appl. No. 13/207,164, dated Aug. 29, 2013, 34 pgs.
US Notice of Allowance in U.S. Appl. No. 13/207,164, dated Nov. 27, 2013, 12 pgs.
International Search Report dated Mar. 19, 2013 as received in Application No. PCT/US2012/062784.
Written Opinion of the International Searching Authority dated Mar. 19, 2013 as received in Application No. PCT/US2012/062784.
Chinese Office Action in Chinese Application No. 201180048973.7, dated Jan. 30, 2015, 10 pgs.
Japanese Office Action in Japanese Application No. 2014-540038, dated Mar. 17, 2015, 11 pgs.
KR Office Action dated Jun. 19, 2015 as received in Application No. 10-2014-7014579 (English Translation).
Chinese Office Action in Chinese Application No. 201080017252.5, dated May 26, 2015, 7 pgs.
Chinese Office Action in Chinese Application No. 201180048973.7, dated Aug. 12, 2015, 8 pgs.
European Office Action in European Application No. 15158419.0, dated Jun. 9, 2015, 7 pgs.
Korean Office Action in Korean Application No. 10-2014-7014579, dated Jun. 19, 2015, 13 pgs.
Chen, Yaow-Ming, Multiinput Converter With Power Factor Correction, Maximum Power Point Tracking, and Ripple-Free Input Currents, IEEE Transactions on Power Electronics, vol. 19, No. 3, May 204, pp. 631-639.
Sefa, Ibrahim et al., Experimental Study of Interleaved MPPT Converter for PV Systems, IECON 2009, 35th Annual Conference of IEEE Industrial Electronics, Nov. 3-5, 2009, pp. 456-461.
US Office Action in U.S. Appl. No. 12/711,040, dated Jun. 18, 2015, 37 pgs.
US Restriction Requirement in U.S. Appl. No. 13/957,227, dated Jun. 3, 2015, 7 pgs.
JP Office Action dated Aug. 18, 2015 as received in Application No. 2014-540038.
Extended European Search Report dated Dec. 18, 2014 as received in Application No. 12846494.8.
European Office Action in European Application No. 12846494.8, dated Oct. 16, 2015, 4 pgs.
Japanese Office Action in Japanese Application No. 2014-540038, dated Aug. 18, 2015, 19 pgs.
Japanese Office Action in Japanese Application No. 2015-026500, dated Oct. 20, 2015, 12 pgs.
US Office Action in U.S. Appl. No. 12/711,040, dated Sep. 25, 2015, 37 pgs.
US Office Action in U.S. Appl. No. 13/957,227, dated Sep. 11, 2015, 20 pgs.
US Restriction Requirement in U.S. Appl. No. 14/053,482, dated Oct. 27, 2015, 20 pgs.

* cited by examiner

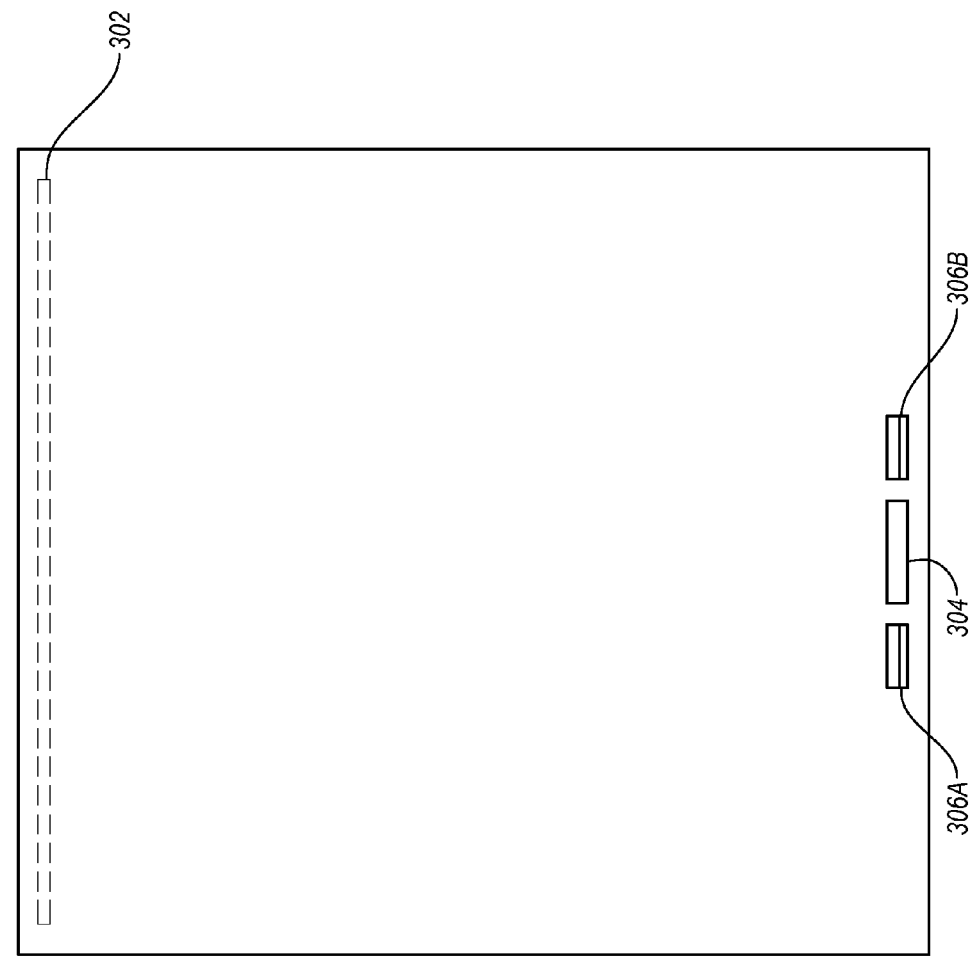

CELL-TO-GRID REDUNDANDT PHOTOVOLTAIC SYSTEM

CROSS-REFERENCE TO RELATED APPLICATIONS

This application is a continuation-in-part of U.S. patent application Ser. No. 12/815,913, filed Jun. 15, 2010, titled ILLUMINATION AGNOSTIC SOLAR PANEL, and is a continuation-in-part of U.S. patent application Ser. No. 13/207,164, filed Aug. 10, 2011, titled HIGHLY EFFICIENT SOLAR ARRAYS, which claims the benefit of and priority to U.S. Provisional Application No. 61/392,862, filed Oct. 13, 2010, titled MULTI-POSITION, HIGHLY REDUNDANT PV ARRAY.

This application also claims the benefit of and priority to:
U.S. Provisional Application No. 61/553,822, filed Oct. 31, 2011, titled CONTINUOUS WIRE SOLAR PANEL CONNECTORS;
U.S. Provisional Application No. 61/554,710, filed Nov. 2, 2011, titled PHASE BALANCING USING A SOLAR ARRAY OR A SOLAR/STORAGE ARRAY;
U.S. Provisional Application No. 61/585,720, filed Jan. 12, 2012, titled MICRO-REPLICATION PATTERNS FOR SOLAR REFLECTORS;
U.S. Provisional Application No. 61/590,925, filed Jan. 26, 2012, titled HIGHLY EFFICIENT SOLAR GREENHOUSE;
U.S. Provisional Application No. 61/620,566, filed Apr. 5, 2012, titled REDUNDANT SOLAR MODULE AND SYSTEM;
U.S. Provisional Application No. 61/694,548, filed Aug. 29, 2012, titled HIGHLY EFFICIENT, REDUNDANT LOW-VOLTAGE PHOTOVOLTAIC SOLAR TOPOLOGY;
U.S. Provisional Application No. 61/694,559, filed Aug. 29, 2012, titled EFFECT OF PHOTOVOLTAIC MODULE SHADING PROPERTIES ON PROJECT ENERGY DENSITY; and
U.S. Provisional Application No. 61/699,701, filed Sep. 11, 2012, titled CELL-TO-GRID REDUNDANT PHOTOVOLTAIC ARRAY.

All of the foregoing applications are incorporated herein by reference in their entireties.

FIELD

Example embodiments described herein relate to photovoltaic (PV) systems with multiple redundant paths from individual PV cells to an electrical power grid.

BACKGROUND

In a conventional photovoltaic array, most, if not all, connections used starting at the cell level and continuing out to the grid connection are single-point-of-failure. Any failed connection anywhere in the system results in a complete failure and an unscheduled service call. Several new topologies have been developed to at least separate the individual modules from each other; however, these topologies are also made up of single-point-of-failure devices, and given the added quantity required, minimal to no improvement in reliability is expected.

The subject matter claimed herein is not limited to embodiments that solve any disadvantages or that operate only in environments such as those described above. Rather, this background is only provided to illustrate one exemplary technology area where some embodiments described herein may be practiced.

SUMMARY

This Summary is provided to introduce a selection of concepts in a simplified form that are further described below in the Detailed Description. This Summary is not intended to identify key features or essential characteristics of the claimed subject matter, nor is it intended to be used as an aid in determining the scope of the claimed subject matter.

Some example embodiments described herein generally relate to PV systems with multiple redundant paths from individual PV cells to an electrical power grid.

In an example embodiment, a photovoltaic system includes multiple photovoltaic modules and a module-to-module bus. Each photovoltaic module defines a first end and a second end opposite the first end. Each photovoltaic module includes multiple photovoltaic cells and multiple converters. Energy generated by each photovoltaic cell has multiple paths through the photovoltaic cells to the second end. The converters are electrically coupled to the photovoltaic cells at the second end such that energy generated by each photovoltaic cell is receivable at any of the converters. The module-to-module bus is electrically coupled to each of the photovoltaic modules. The module-to-module bus has an output. Energy generated by each photovoltaic module is receivable at the output independent of any other of the photovoltaic modules.

In another example embodiment, a photovoltaic system includes multiple photovoltaic modules, a module-to-module bus, and multiple inverters. Each photovoltaic module defines a first end and a second end opposite the first end. Each photovoltaic module includes multiple photovoltaic cells. Energy generated by each photovoltaic cell has multiple paths through the photovoltaic cells to the second end. The converters are electrically coupled to the photovoltaic cells at the second end such that energy generated by each photovoltaic cell is receivable at any of the converters. The module-to-module bus is electrically coupled to each of the photovoltaic modules such that the photovoltaic modules are electrically connected in parallel. The inverters are electrically coupled to the module-to-module bus such that energy generated by each photovoltaic module is receivable at any of the inverters.

Additional features and advantages of the invention will be set forth in the description which follows, and in part will be obvious from the description, or may be learned by the practice of the invention. The features and advantages of the invention may be realized and obtained by means of the instruments and combinations particularly pointed out in the appended claims. These and other features of the present invention will become more fully apparent from the following description and appended claims, or may be learned by the practice of the invention as set forth hereinafter.

BRIEF DESCRIPTION OF THE DRAWINGS

To further clarify the above and other advantages and features of the present invention, a more particular description of the invention will be rendered by reference to specific embodiments thereof which are illustrated in the appended drawings. It is appreciated that these drawings depict only typical embodiments of the invention and are therefore not to be considered limiting of its scope. The invention will be described and explained with additional specificity and detail through the use of the accompanying drawings in which:

FIG. 3A is a back view of an embodiment of a continuous backsheet included in the PV module of FIG. 2;

DETAILED DESCRIPTION OF SOME EXAMPLE EMBODIMENTS

Embodiments of the invention generally relate to a photovoltaic (PV) system supporting multiple redundant paths from individual PV cells to an electrical power grid. The redundancy provides fault tolerance in the PV system and may substantially reduce or eliminate maintenance requirements through the service life of the PV system compared to PV systems lacking such redundancy.

In more detail, an example PV system according to some embodiments is described where single-points-of-failure existing in some conventional PV systems have been replaced by connection points having various levels of redundancy. This allows for failure without stoppage of an entire PV module, and allows for either no repair—resulting in little to no energy lost—or at least a scheduled repair rather than an unscheduled repair.

In some embodiments described herein, all PV cells of a given PV module have some combination of parallel and serial connections such that current can take alternate paths through the PV module. A low impedance continuous backsheet is used across the rear of the PV module to allow for a single direction of current flow. Any failed interconnect or PV cell has minimum impact as the current can flow through an alternate route to converters included in the PV module.

The converters are interconnected to an internal bus strip within the PV module that allows any converter to see any cell, e.g., energy generated by a given cell can be received at any of the converters. Thus, some of the converters can fail without impacting energy production of the PV module. The converters output a fixed voltage direct current (DC) power to an output bus which is connected to a large cross-sectional area riser (or connector). The riser connects to a module-to-module bus without splicing the module-to-module bus such that the module-to-module bus remains continuous. As a result, each PV module is connected to the module-to-module bus independently of the others and a failure of one PV module will not affect the connections of other PV modules to the module-to-module bus.

The module-to-module bus is interconnected to multiple fixed voltage DC:AC conversion devices, or "inverters" herein. The inverters are connected to the electrical power grid and convert DC power on the module-to-module bus to AC power that is output to the electrical power grid. If some of the inverters fail, power can continue to flow through the other inverters. Accordingly, the entire PV system is cell-to-grid redundant as energy produced by each PV cell can take any one of multiple redundant paths to the electrical power grid.

Reference will now be made to the drawings to describe various aspects of example embodiments of the invention. It is to be understood that the drawings are diagrammatic and schematic representations of such example embodiments, and are not limiting of the present invention, nor are they necessarily drawn to scale.

I. Example PV System

Figure 1:
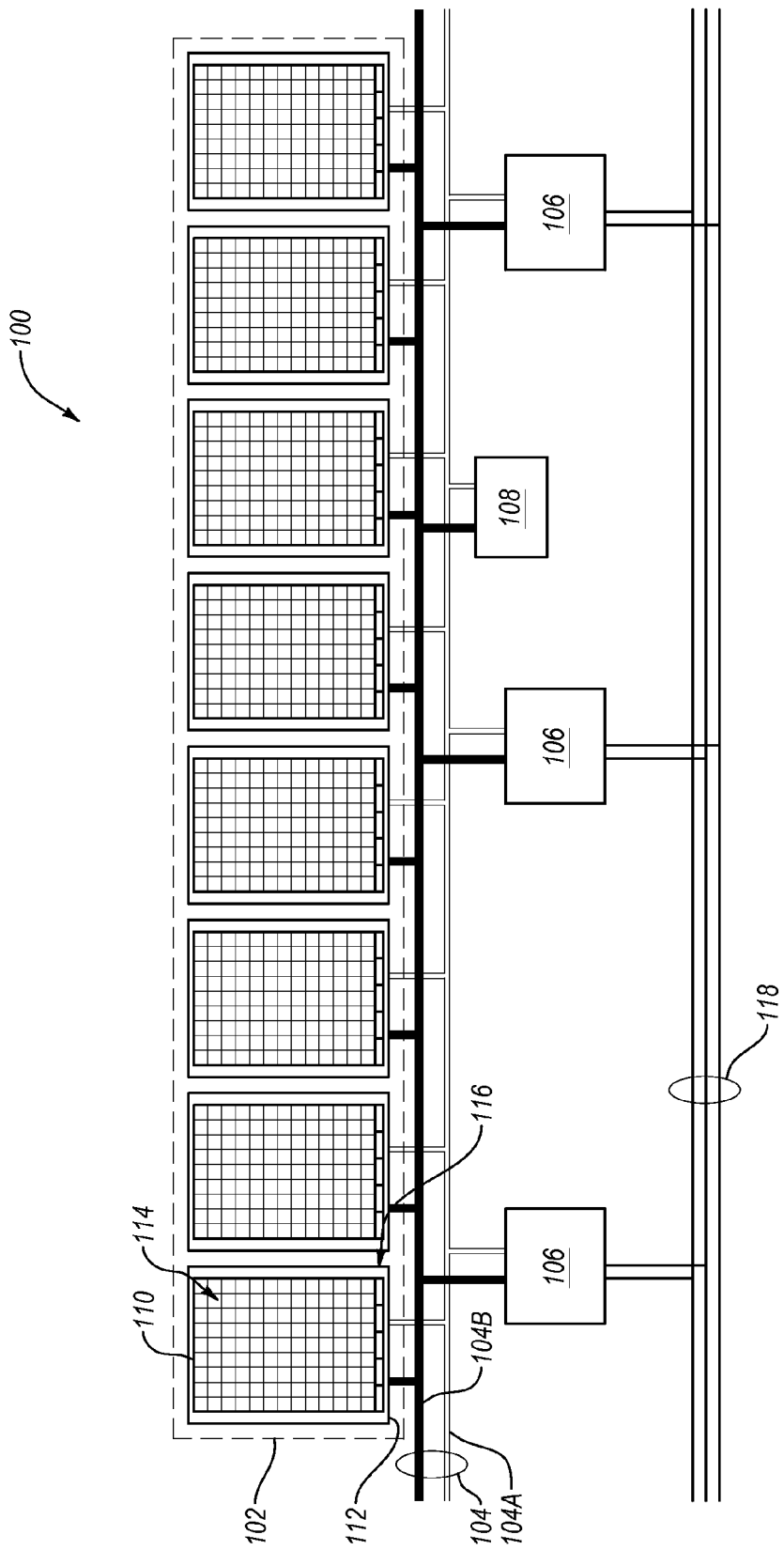
FIG. 1 illustrates an example PV system according to some embodiments.

FIG. 1 illustrates an example PV system 100, arranged in accordance with at least some embodiments described herein. The PV system 100 includes multiple PV modules or panels (hereinafter "modules") 102 and a module-to-module bus 104. Optionally, the PV system 100 additionally includes multiple inverters 106 and/or one or more energy storage devices 108.

An example configuration of each of the PV modules 102 will now be described. Although the specific aspects and features of the example configuration described herein are only called out in one of the PV modules 102 of FIG. 1, it is understood that each of the PV modules 102 may be similarly configured.

As illustrated in FIG. 1, each of the PV modules 102 defines a first end 110 and a second end 112. Each of the PV modules 102 includes multiple PV cells 114 electrically coupled together in a mesh such that energy, e.g., PV current, generated by each PV cell 114 has multiple paths through the PV cells 114 to the second end 112. In some embodiments, the mesh topology of the PV cells 114 is achieved by arranging the PV cells 114 in rows where the rows are coupled in series and the PV cells 114 in each row are coupled in parallel.

In some PV modules, the PV cells are electrically coupled in series such that an under-illuminated or poorly-performing or otherwise "blocked" PV cell limits the entire series. In embodiments described herein, however, because each PV cell 114 has multiple paths to the second end 112, when a PV cell 114 in one of the paths is blocked, energy produced by PV cells 114 upstream (e.g., nearer the first end 110) of the blocked PV cell 114 can flow around the blocked PV cell 114 through one of the other available paths.

Each of the PV modules 102 additionally includes multiple converter circuits (hereinafter "converters") 116 electrically coupled to the PV cells 114 at the second end 112 such that energy generated by each PV cell 114 is receivable at any of the converters 116. As such, if one of the converters 116 fails, the energy that was previously flowing to that converter 116 can flow to a different one of the converters 116. In general, the converters 116 are configured to convert relatively high-current, low-voltage energy collectively generated by the PV cells 114 to a lower current and higher voltage. Accordingly, each of the converters 116 may include, for example, a boost converter, a buck-boost converter, a SEPIC converter, a Ćuk converter, or the like or any combination thereof.

The module-to-module bus 104 is electrically coupled to each of the PV modules 102 such that the PV modules 102 are connected in parallel. The module-to-module bus 104 has at least one output and energy generated by each PV module 102 is receivable at the output independent of any other of the PV modules 102. In the illustrated embodiment, the module-to-module bus 104 has four outputs, including a different output coupled to each of the inverters 106 and to the energy storage device 108 such that energy on the module-to-module bus 104 can be output to any or all of the inverters 106 and/or the energy storage device 108. The outputs of the module-to-module bus 104 can also function as inputs in some embodiments such that energy received through the inverters 106 and/or from the energy storage device 108 may be received on the module-to-module bus 104.

The module-to-module bus 104 is a DC bus for the DC output of the PV modules 102. In the illustrated embodiment, the module-to-module bus 104 includes a positive lead 104A and a negative lead 104B. Each of the positive lead 104A and the negative lead 104B may include a continuous and uninterrupted wire to which each of the PV modules 102 is electrically coupled. Because the leads 104A, 104B of the module-to-module bus 104 include continuous wires and the PV modules 102 are connected in parallel to the module-to-module bus 104, a failure of any one of the PV modules 102 will not affect an ability of any of the other PV modules 102 to output energy onto the module-to-module bus 104 to the inverters 106 and/or to the energy storage device 108. Accordingly, the PV system 100 can continue producing energy even in the event some of the PV modules 102 fail such that immediate maintenance on the failed PV modules 102 is not required to keep the PV system 100 running, as is the case with some PV systems where the PV modules or panels are connected in series.

The inverters 106 are electrically coupled to the module-to-module bus 104 such that energy generated by each of the PV modules 102 is receivable at any of the inverters 106. The inverters 106 each have a DC side, the DC sides of the inverters 106 being electrically coupled in parallel to the module-to-module bus 104. In general, the inverters 106 are configured to convert DC power on the module-to-module bus 104 to alternating current (AC) power that is output to an electrical power grid 118 (hereinafter "power grid 118") to which AC sides of the inverters 106 are coupled.

The inverters 106 may include fixed voltage inverters and the inverters 106 may control the voltage on the module-to-module bus 104. Alternately or additionally, the inverters 106 include reversible inverters such that when operated in reverse, the inverters 106 convert AC power from the power grid 118 to DC power that is output to the module-to-module bus 104 to charge the energy storage device 108, for example. Alternately or additionally, the inverters 106 are operated in a "fixed turn" configuration in which a ratio between the AC output voltage to the DC input voltage is fixed, causing the DC voltage to float with AC voltage fluctuations.

The power grid 118 may include a multiphase AC power grid, such as a three-phase AC power grid. The inverters 106 may be electrically coupled to any or all of the phases of the power grid 118. In the illustrated embodiment, each of the inverters 106 is electrically coupled to a different one of the three phases of the power grid 118 through, for example, a Wye or a Delta connection.

The energy storage device 108 may be coupled in parallel to the module-to-module bus 104.

In some embodiments, the inverters 106 have different DC setpoints. For example, the DC setpoints of the inverters 106 may be offset by 0.1-0.5 volts, or by less than 0.1 volts or more than 0.5 volts. In an example embodiment, one of the inverters 106 has a DC setpoint of 52.0 volts, another has a DC setpoint of 52.5 volts, and another has a DC setpoint of 53.0 volts. Where the inverters 106 have different DC setpoints, power distribution from the module-to-module bus 104 to the inverters 106 is determined by the DC setpoints. For example, the inverter 106 with the lowest DC setpoint, such as 52.0 volts, will begin pulling power when the voltage on the module-to-module bus 104 is 52.0 volts; if the voltage on the module-to-module bus 104 rises to the next DC setpoint, such as 52.5 volts, the inverter 106 with the next DC setpoint will then begin pulling power, and so on.

Alternately or additionally, the DC setpoints of the inverters 106 and/or AC curtailment of the inverters 106 may be adjustable. In general, AC curtailment is a limiting feature on the AC output from the inverter 106. In these and other embodiments, the inverters 106 may be communicatively coupled together, e.g., via a modbus, a controller area network (CAN) bus, or other communication channel. The inverters 106 may communicate with each other to coordinate control of inverter-specific settings such as the DC setpoints of the inverters 106, AC curtailment of the inverters 106, or other settings or limits.

By coupling each of the inverters 106 to a different phase of the power grid 118, implementing different DC setpoints for the inverters 106 and/or implementing adjustable DC setpoints for the inverters 106, the PV system 100 may be operated in a variety of ways. For example, current may selectively flow from the inverters 106 to different phases of the power grid 118, into the energy storage device 108 and/or from the energy storage device 108. As another example, current may flow from one or more phases of the power grid 118 to the module-to-module bus 104 via one or more of the inverters 106 with a relatively high DC setpoint and may flow along the module-to-module bus 104 with or without power generated by the PV modules 102 to one or more other phases of the power grid 118 via one or more of the inverters 106 with a relatively low DC setpoint. As another example, based on DC setpoints of the inverters 106 and a current state of charge of the energy storage device 108, current may flow into the energy storage device 108 from any or all phases of the power grid 118 or from the energy storage device 108 into any or all phases of the power grid 118.

Alternately or additionally, each of the inverters 106 may be selectively disabled and enabled based on one or more criteria. The criteria may be static or adjustable. The criteria may include voltage on the module-to-module bus 104, time of day, or other criteria. For example, one or more of the inverters 106 may be disabled every morning and/or evening when output of the PV modules 102 is expected to be relatively lower than at midday such that the remaining enabled inverters 106 operate at a relatively higher efficiency or the PV system 100 performance is otherwise optimized.

II. PV Module

Figure 2:
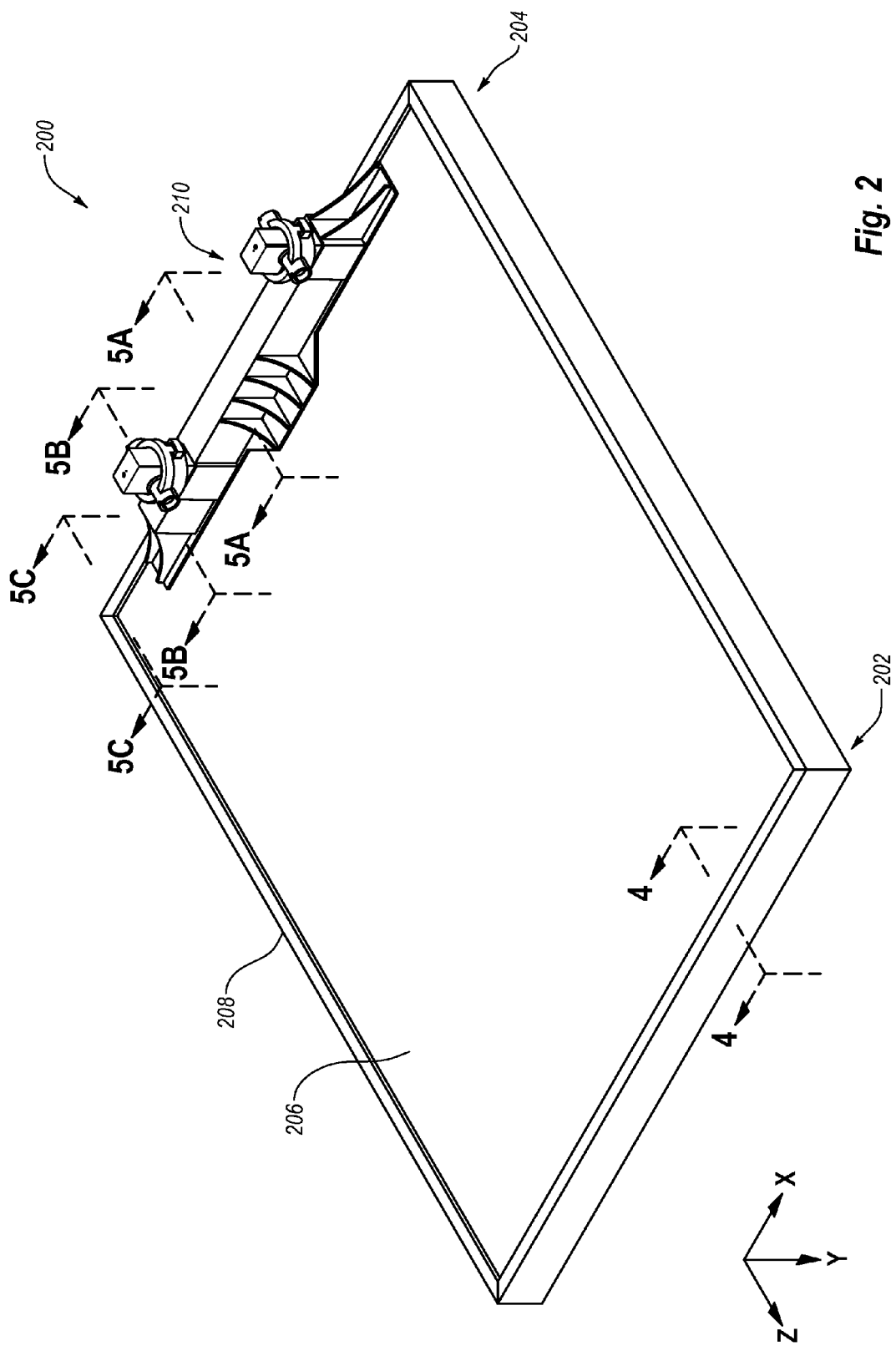
FIG. 2 illustrates an example PV module that may be included in the PV system of FIG. 1.

FIG. 2 illustrates an example PV module 200 that may be included in the PV system 100 of FIG. 1, arranged in accordance with at least some embodiments described herein. For example, the PV module 200 is an example embodiment of the PV modules 102 of FIG. 1. The view in FIG. 2 is an upside-down perspective view of the PV module 200. FIG. 2 additionally includes arbitrarily-defined X, Y, and Z coordinate axes which are used throughout the various Figures to provide a consistent frame of reference. In the discussion that follows, a "top" or "front" of the PV module 200 (or subcomponent thereof) refers to the positive Y side of the PV module 200 (or subcomponent), while "bottom" or "back" refers to the negative Y side.

In the illustrated embodiment, the PV module 200 defines a first end 202 and a second end 204 corresponding to the first end 110 and the second end 112, respectively, of each of the PV modules 102 of FIG. 1. The PV module 200 includes a continuous backsheet 206 and may optionally include a frame 208 around a perimeter of the continuous backsheet 206 and various layers of the PV module 200 (described in greater detail below with respect to FIGS. 4-5C). The PV module 200 additionally includes multiple PV cells (not shown in FIG. 2) within the various layers of the PV module 200 and multiple converters (not shown in FIG. 2). The multiple converters are included in an undermount assembly 210 mounted to the bottom of the PV module 200 at the second end 204 in the illustrated embodiment. FIG. 2 additionally includes various cutting planes 4-4, 5A-5A, 5B-5B, and 5C-5C referenced in the discussions of FIGS. 4, 5A, 5B, and 5C below.

The continuous backsheet 206 in some embodiments generally extends from edge to edge of the PV module 200 and cooperates with the frame 208 and a transparent front plate (not shown) of the PV module 200 to enclose the PV cells (not shown) of the PV module 200 and protect against moisture ingress into the PV module 200. The continuous backsheet 206 may be between 0.025 to 0.4 millimeters (mm) thick and includes an electrically-conductive material such as, but not limited to, aluminum.

The continuous backsheet 206 may be a ground plane for the PV cells of the PV module 200. For example, the continuous backsheet 206 may be electrically coupled between a first subset of the PV cells (e.g., a first row of the PV cells as described with respect to FIG. 4) at the first end 202 and a second subset of the PV cells (e.g., a last row of the PV cells as described with respect to FIGS. 5A-5C) at the second end. A first end connection (not shown) between the continuous backsheet 206 and the first subset of PV cells may be an anode of the PV module 200 as described in more detail below. A second end connection (not shown) between the multiple converters and the second subset of PV cells may be a cathode of the PV module 200 as described in more detail below. In these and other embodiments, module return current may be carried by the continuous backsheet 206 from the cathode to the anode of the PV module 200.

III. Continuous Backsheet

FIG. 3A is a back view of an embodiment 206A of the continuous backsheet 206 of FIG. 2, hereinafter "continuous backsheet 206A", arranged in accordance with at least some embodiments described herein. In the illustrated embodiment, the continuous backsheet 206A includes a ground strip 302 mechanically and electrically coupled to the continuous backsheet 206A at the first end 202 of the PV module 200.

The ground strip 302 may include copper, hot-dipped copper, tin-coated copper, or other electrically-conductive and solderable material. The ground strip 302 is ultrasonically welded to the continuous backsheet 206A in some embodiments. The ground strip 302 may have a thickness (e.g., in the Y direction) of about 100 micrometers (μm) and a width (e.g., in the Z direction) of about 10 mm.

The continuous backsheet 206A additionally defines a slot 304 and includes one or more tabs 306A, 306B (collectively "tabs 306"). The slot 304 in some embodiments has a width (e.g., a dimension in the Z direction) in a range from about 3 to 8 mm and a length (e.g., a dimension in the X direction) in a range from about 75 to 200 mm.

The tabs 306 in the illustrated embodiment include discrete tabs mechanically and electrically coupled to the continuous backsheet 206A. The tabs 306 may include copper, hot-dipped copper, tin-coated copper, or other electrically-conductive and solderable material. During assembly in some embodiments, a lengthwise edge of each of the tabs 306 is ultrasonically welded to the continuous backsheet 206A before the unwelded portion is bent to extend away from the continuous backsheet 206. The tabs 306 in some embodiments have a thickness (e.g., in the Y direction) of about 100 μm and a width (e.g., in the Z direction) before being bent of about 10 mm to about 14 mm.

Figure 3B:
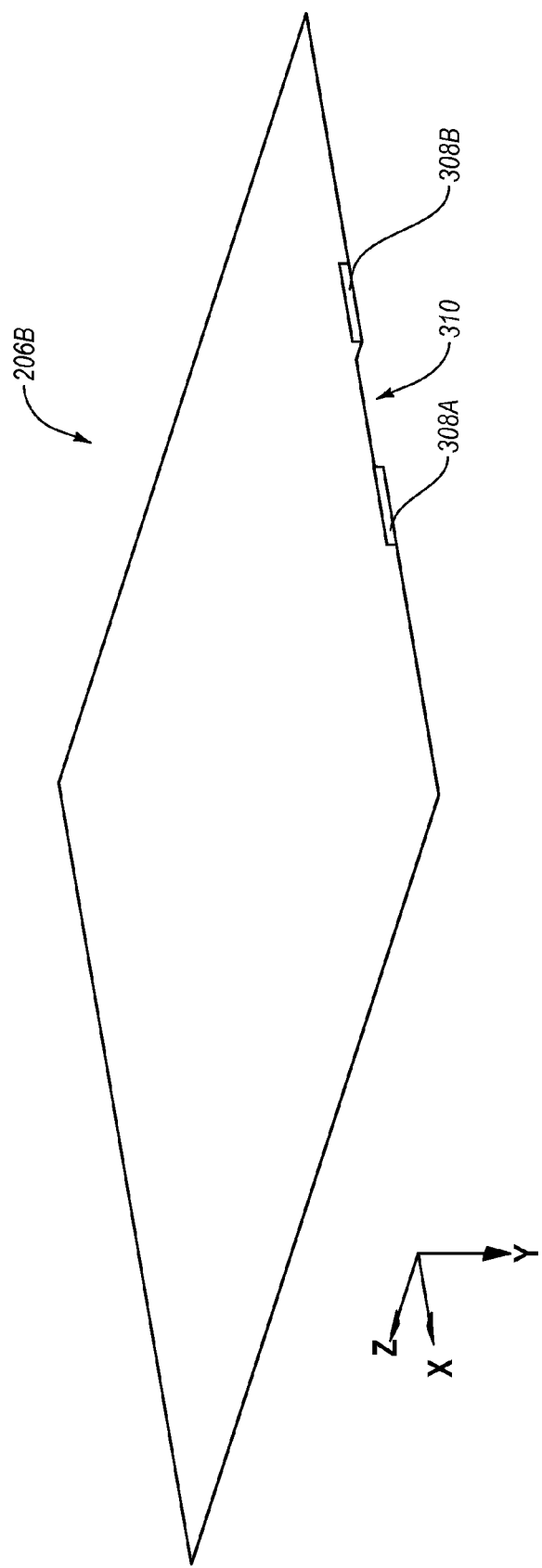
FIG. 3B is a back view of another embodiment of the continuous backsheet included in the PV module of FIG. 2.

FIG. 3B is a back perspective view of an embodiment 206B of the continuous backsheet 206 of FIG. 2, hereinafter "continuous backsheet 206B," arranged in accordance with at least some embodiments described herein. The continuous backsheet 206B is similar in some respects to the continuous backsheet 206A. For example, the continuous backsheet 206B may include a ground strip (not shown), such as the ground strip 302 of FIG. 3A, mechanically and electrically coupled to the continuous backsheet 206B at the first end 202 of the PV module 200.

Similar to the continuous backsheet 206A, the continuous backsheet 206B additionally includes tabs 308A, 308B (collectively "tabs 308") that are similar in some respects to the tabs 306. For example, both of the tabs 306, 308 are located on the continuous backsheet 206A, 206B at the second end 204. Additionally, both of the tabs 306, 308 extend away from the continuous backsheet 206A, 206B in a plane substantially normal to a plane defined by the continuous backsheet 206A, 206B. However, the tabs 308 of FIG. 3B are integral tabs integrally formed from the continuous backsheet 206B. Thus, the tabs 308 may include the same material(s) as the continuous backsheet 206B.

The continuous backsheet 206B additionally defines a cutout 310 rather than the slot 304 of FIG. 3A.

Figure 4:
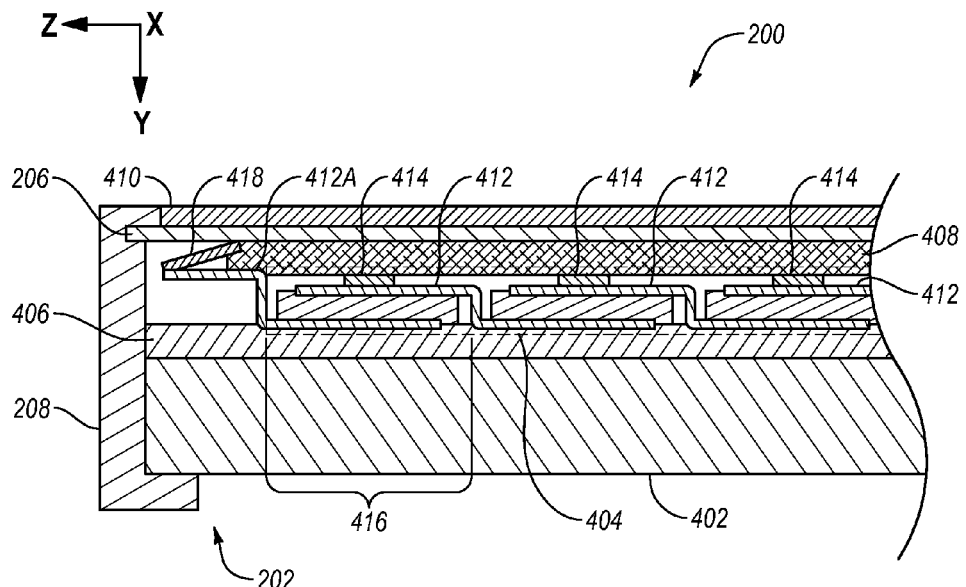
FIG. 4 illustrates a cross-sectional view of a first end of the PV module of FIG. 2.

Aspects of the slot 304, tabs 306, 308, cutout 310, and the PV module 200 of FIGS. 2-3B will now be explained with reference to FIGS. 4-5C. FIG. 4 illustrates a cross-sectional view of the first end 202 of the PV module 200 at the cutting plane 4-4 of FIG. 2, arranged in accordance with at least some embodiments described herein. FIGS. 5A-5C each illustrate a cross-sectional view of the second end 204 of the PV module 200 of FIG. 2 at the respective cutting plane 5A-5A, 5B-5B, and 5C-5C of FIG. 2, all arranged in accordance with at least some embodiments described herein. For simplicity, the undermount assembly 210 has been omitted from FIGS. 5A-5C.

With reference to FIG. 4, the PV module 200 includes the continuous backsheet 206, the frame 208, a transparent front plate 402, and multiple rows of PV cells 404 sandwiched between the continuous backsheet 206 and the front plate 402. In the view of FIG. 4, only one PV cell 404 in each of the rows of PV cells 404 is visible. The PV module 200 additionally includes an adhesive layer 406, a buffer layer 408, and an optional backskin 410.

The front plate 402 includes a substrate that is substantially transparent to at least some wavelengths of solar radiation. For example, the front plate 402 may include glass, plastic, or the like. The front plate 402 cooperates with the continuous backsheet 206 and the frame 208 to protect the PV cells 404 and other internal layers of the PV module 200 from moisture ingress.

The adhesive layer 406 mechanically couples the front plate 402 to the PV cells 404. The adhesive layer 406 may include ethylene-vinyl acetate (EVA), or other suitable adhesive. The adhesive layer 406 is substantially transparent to at least some wavelengths of solar radiation.

The buffer layer 408 mechanically couples the continuous backsheet 206 to the PV cells 404 and/or electrically insulates the PV cells 404 from the continuous backsheet 206. Thus, the buffer layer 408 may include an adhesive, an electrically-insulating material, or other suitable material, such as, but not limited to, EVA, polyethylene terephthalate (PET), or the like or any combination thereof.

The backskin 410 may include black PET or other material with a relatively high emissivity to facilitate cooling of the PV module 200. The backskin 410 may be slightly undersized compared to the continuous backsheet 206 along a perimeter of the backskin 410 to allow the frame 208 to wrap over the continuous backsheet 206 along its perimeter to allow edge sealing. Although not shown, an adhesive and/or sealant may be provided between the wrapped-over portion of the frame 208 and the continuous backsheet 206 along the perimeter of the continuous backsheet 206 for edge sealing.

Generally speaking, all of the PV cells 404 convert solar energy into electrical energy by the photovoltaic effect. The PV cells 404 may be p-type cells or n-type cells. In the discussion that follows, it is assumed that the PV cells 404 are p-type cells unless stated otherwise. Each of the PV cells 404 may have the same or substantially the same dimensions. In some embodiments, the dimensions of each of the PV cells 404 are one of: 156 mm by 156 mm, or 78 mm by 156 mm. Alternately, each of the PV cells 404 may have different dimensions than those listed. In some embodiments, the PV cells 404 are arranged in an array or rectangular pattern. For example, 156 mm by 156 mm PV cells 404 may be arranged in a 6×10 array (or rectangular pattern of 6×24 PV cells 404), a 6×12 array, or an 8×12 array. As another example, 78 mm by 156 mm PV cells may be arranged in a 6×15 array, a 6×20 array, a 6×24 array, an 8×20 array, or an 8×24 array. The foregoing dimensions and array configurations are provided by way of example only and should not be construed to limit the invention.

The rows of PV cells 404 are electrically coupled in series by serial interconnects 412, including multiple serial interconnects 412 coupling each row of PV cells 404 to a corresponding adjacent row. For example, in some embodiments, at least one serial interconnect 412 couples a front side—or anode for p-type cells—of each PV cell 404 to a back side—or cathode for p-type cells—of a corresponding PV cell 404 in an adjacent row of PV cells 404 such that each PV cell 404 in a row has at least one direct electrical connection via a corresponding serial interconnect 412 to an adjacent row of PV cells 404.

The PV cells 404 in each row are electrically coupled together in parallel by conductive row strips 414. For example, the conductive row strip 414 running across the back of the right-most row of PV cells 404 in FIG. 4 electrically couples back sides of each of the PV cells 404 in the right-most row together, while the conductive row strip 414 running across the back of the middle row of PV cells 404—together with the serial interconnects 412 from the front side of the right-most row to the back side of the middle row—electrically couples front sides of the PV cells 404 in the right-most row together such that the PV cells 404 in the right-most row are coupled together in parallel.

Each of the conductive row strips 414 may have a thickness (e.g., a dimension in the Y direction) in a range from about 25 μm to about 200 μm and a width (e.g., a dimension in the Z direction) in a range from about 2 mm to about 20 mm. Each of the conductive row strips 414 may have a same length (e.g., a dimension in the X direction) or about the same length as the corresponding row of PV cells 404.

As mentioned previously, energy generated by each PV cell 404 has multiple paths through the PV cells 404 to the second end 204 (not shown in FIG. 4) of the PV module 200. The multiple paths through the PV cells 404 include the conductive row strips 414 and/or the serial interconnects 412 in some embodiments, such that generated current can flow, via the conductive row strips 414 and/or the serial interconnects 412, around blocked PV cells 404 and through PV cells 404 with relatively higher performance and/or higher illumination to the second end 204.

The rows of PV cells 404 include a first row 416 at the first end 202 of the PV module 200. As illustrated in FIG. 4, serial interconnects 412A electrically and mechanically couple the first row 416 of PV cells 404 to a ground strip 418 such that the first row 416 of PV cells 404 is electrically coupled to the continuous backsheet 206. In some embodiments, at least one serial interconnect 412A couples a front side of each PV cell 404 in the first row 416 to the ground strip 418 such that each PV cell 404 in the first row 416 has at least one direct electrical connection via a corresponding serial interconnect 412A to the ground strip 418.

The ground strip 418 may correspond to the ground strip 302 of FIG. 3A. Although illustrated in FIG. 4 as being connected to the front side of the PV cells 404 in the first row 416, where the PV cells 404 are n-type cells, the ground strip 418 may instead be connected to the back side of the PV cells 404 in the first row 416 and other suitable modifications to the electrical connections described herein may be made.

The ground strip 418 and the serial interconnects 412A form the first end connection between the continuous backsheet 206 and the first row 416 of PV cells 404. The first end connection may be the anode of the PV module 200 in some embodiments. A reference voltage at the anode is zero volts since the anode is directly tied through the continuous backsheet 206 to a negative output of the PV module 200.

Figure 5A:
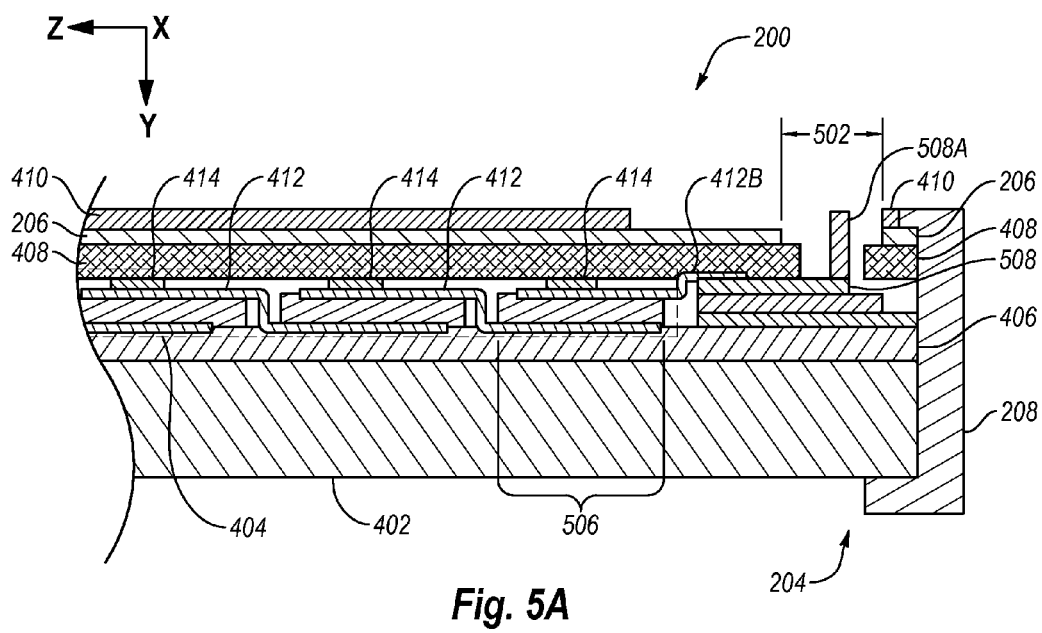
FIGS. 5A-5C each illustrate a cross-sectional view of a second end of the PV module of FIG. 2.
Figure 5B:
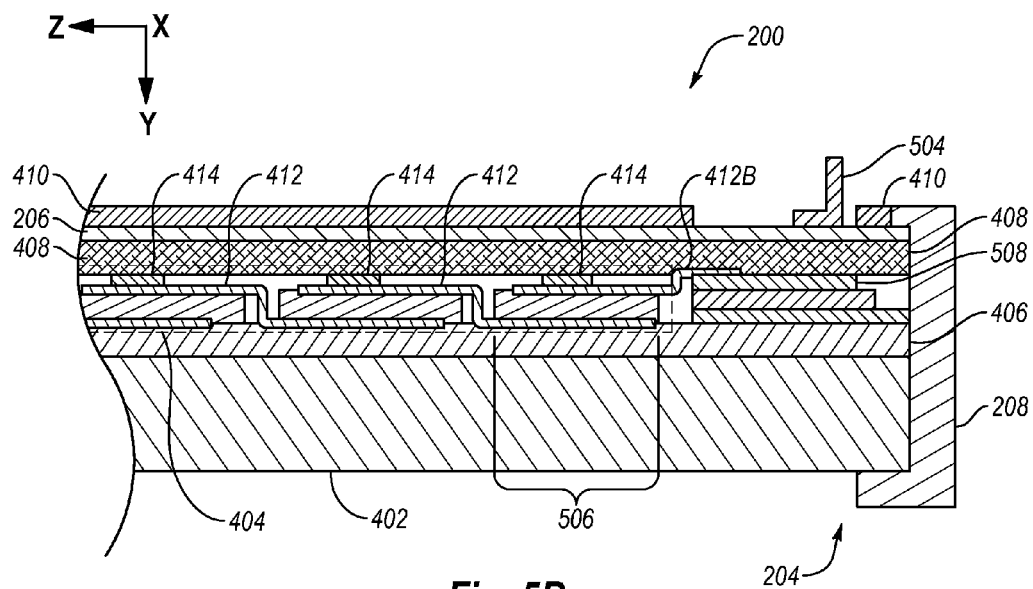
Figure 5C:
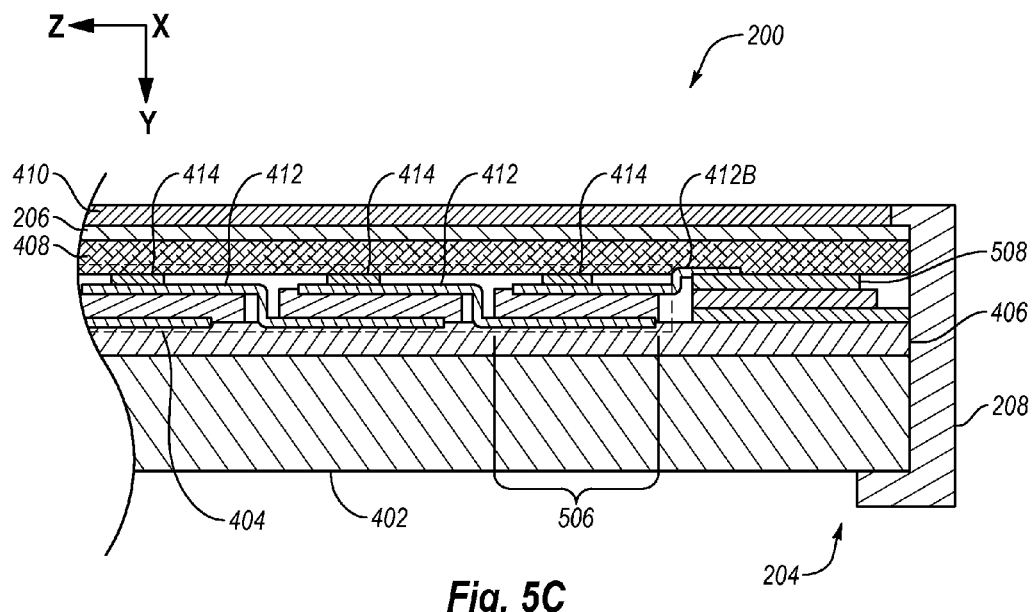

Reference is next made to FIGS. 5A-5C in which cross-sectional views of the second end 204 of the PV module 200 are illustrated. In FIGS. 5A-5C, the continuous backsheet 206 defines a slot 502 (FIG. 5A) and includes tabs 504 (FIG. 5B—only one tab 504 is visible). The slot 502 may correspond to the slot 304 of FIG. 3A and the tabs 504 may correspond to the tabs 306 of FIG. 3A. Thus, the continuous backsheet 206 illustrated in FIGS. 5A-5C includes the same configuration as the continuous backsheet 206A of FIG. 3A. In other embodiments, however, the continuous backsheet 206 illustrated in FIGS. 5A-5C can include the same configuration as the continuous backsheet 206B of FIG. 3B.

As illustrated in FIGS. 5A-5C, the rows of PV cells 404 include a last row 506 at the second end 204 of the PV module 200. Serial interconnects 412B electrically and mechanically couple the last row 506 of PV cells 404 to an internal bus strip 508. The internal bus strip 508 in some embodiments extends along a width (e.g., a dimension in the X direction) of the PV module 200. The internal bus strip 508 may include copper or other electrically-conductive material(s). In some embodiments, at least one serial interconnect 412B couples a back side—or cathode for p-type cells—of each PV cell 404 in the last row 506 to the internal bus strip 508 such that each PV cell 404 in the last row 506 has at least one direct electrical connection via a corresponding serial interconnect 412B to the internal bus strip 508.

Referring to FIG. 5A, the internal bus strip 508 includes a tab 508A extending from the internal bus strip 508 through the slot 502 formed in the continuous backsheet 206 to a positive connector (not shown) of a circuit card (not shown) on which the converters are disposed. The circuit card is disposed within the undermount assembly 210 as described in more detail with respect to FIGS. 6A-6D below and is mechanically coupled to the second end 204 of the PV module 200. The tab 508A may be a discrete tab or an integral tab analogous to the discrete tabs and integral tabs described above with respect to FIGS. 3A-3B. Optionally, the tab 508A may include a stress-relief fold (not shown) formed therein as described in more detail in U.S. patent application Ser. No. 12/357,268, filed Jan. 21, 2009, which application is herein incorporated by reference in its entirety.

The serial interconnects 412B and the internal bus strip 508 form the second end connection between the converters and the last row 506 of PV cells 404. The second end connection may be the cathode of the PV module 200 in some embodiments.

In the illustrated embodiment, current generated by the PV cells 404 nominally flows through the PV cells 404 in a single direction from the first end 202, or anode, to the second end 204, or cathode of the PV module 200. As mentioned previously, however, current may at times flow laterally, e.g., orthogonal to the nominal flow direction, through the conductive row strips 414 to get around blocked PV cells 404. Return current for the PV module 200 flows through the continuous backsheet 206 in the opposite direction, e.g., from the second end 204, or cathode, to the first end 202, or anode.

Referring to FIG. 5B, the tabs 504 extend from the continuous backsheet 206 to a negative connector (not shown) of the circuit card on which the converters are disposed. The tabs 504 electrically couple the continuous backsheet 206 to the negative connector of the circuit card, thereby grounding the circuit card to the continuous backsheet 206. As described with respect to the tabs 306 of FIG. 3A, the tabs 504 may include copper or other electrically-conductive material that is also thermally conductive. Accordingly, the tabs 504 may facilitate thermal transfer of heat generated by the converters from the circuit card to the continuous backsheet 206 and frame 208 and out of the PV module 200. Optionally, the tabs 504 may each include a stress-relief fold (not shown) formed therein as described in more detail in U.S. patent application Ser. No. 12/357,268. In some embodiments, the tabs 504 and the tab 508A are substantially aligned with each other, e.g., the tabs 504 and the tab 508A are substantially co-planar to simplify the soldering of the tabs 504, 508A to the corresponding connectors of the circuit card.

Referring to FIG. 5C, a cross-sectional view of the second end 204 of the PV module 200 is provided cut through an area away from the tabs 508A (FIG. 5A) and 504 (FIG. 5B). As illustrated in FIGS. 4-5C, the continuous backsheet 206 extends all the way to the positive Z and negative Z edges of the PV module 200 to enhance sealing of the PV module 200 in cooperation with the frame 208 and the front plate 402. In a similar manner, the continuous backsheet 206 extends all the way to the positive X and negative X edges of the PV module 200.

IV. Undermount Assembly

Figure 6A:
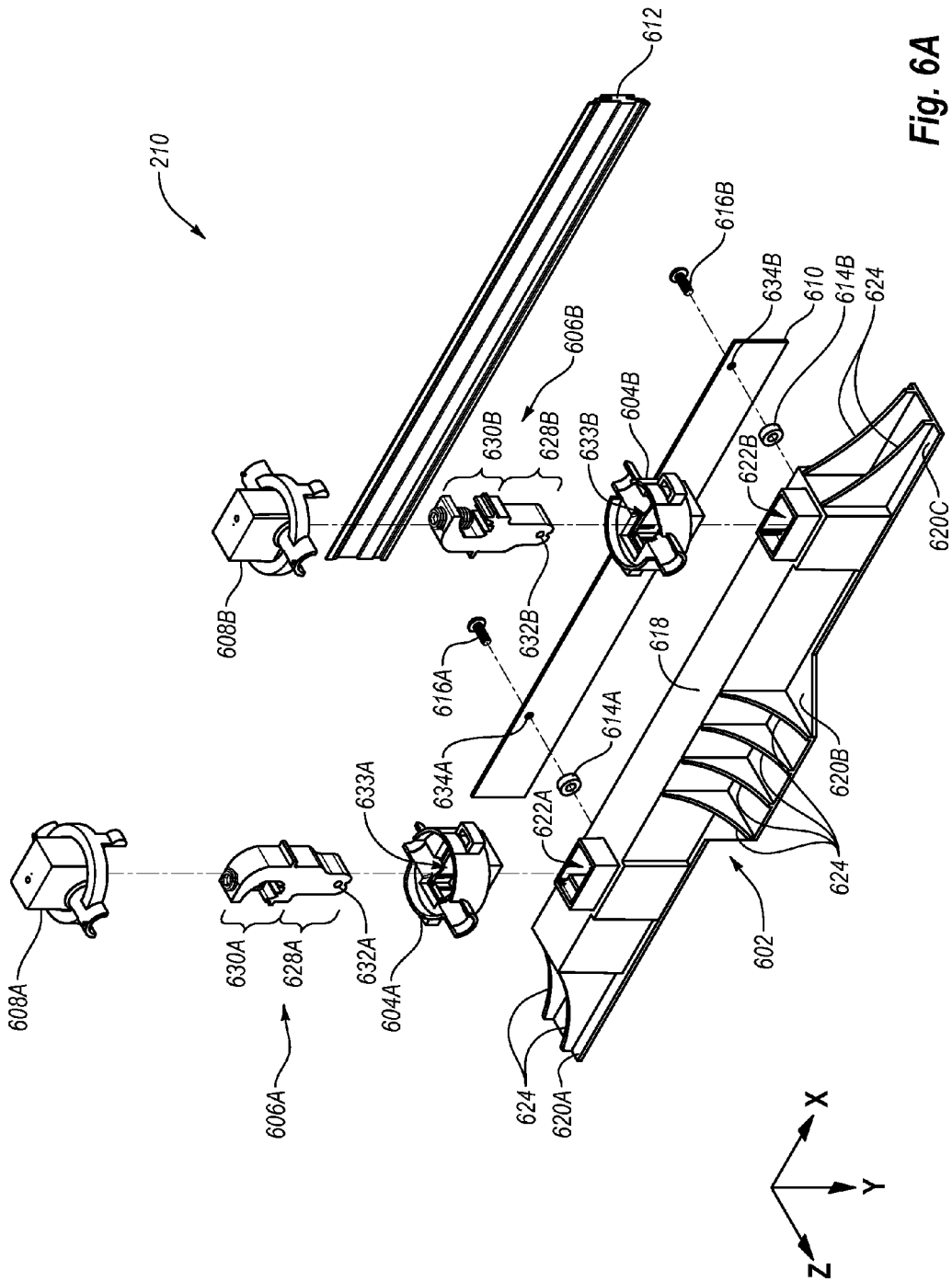
FIGS. 6A-6D illustrate an embodiment of an undermount assembly of the PV module of FIG. 2.
Figure 6B:
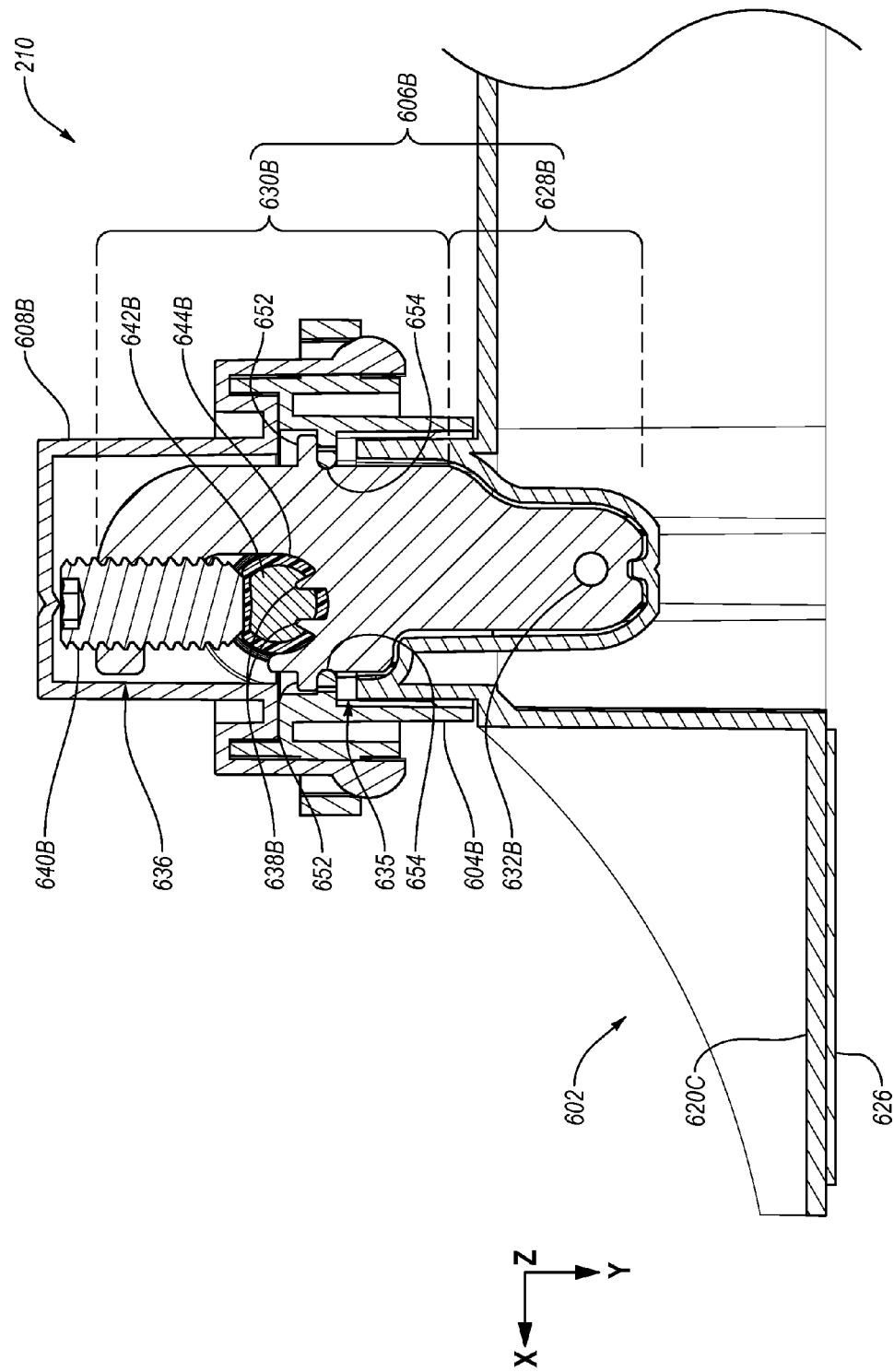
Figure 6C:
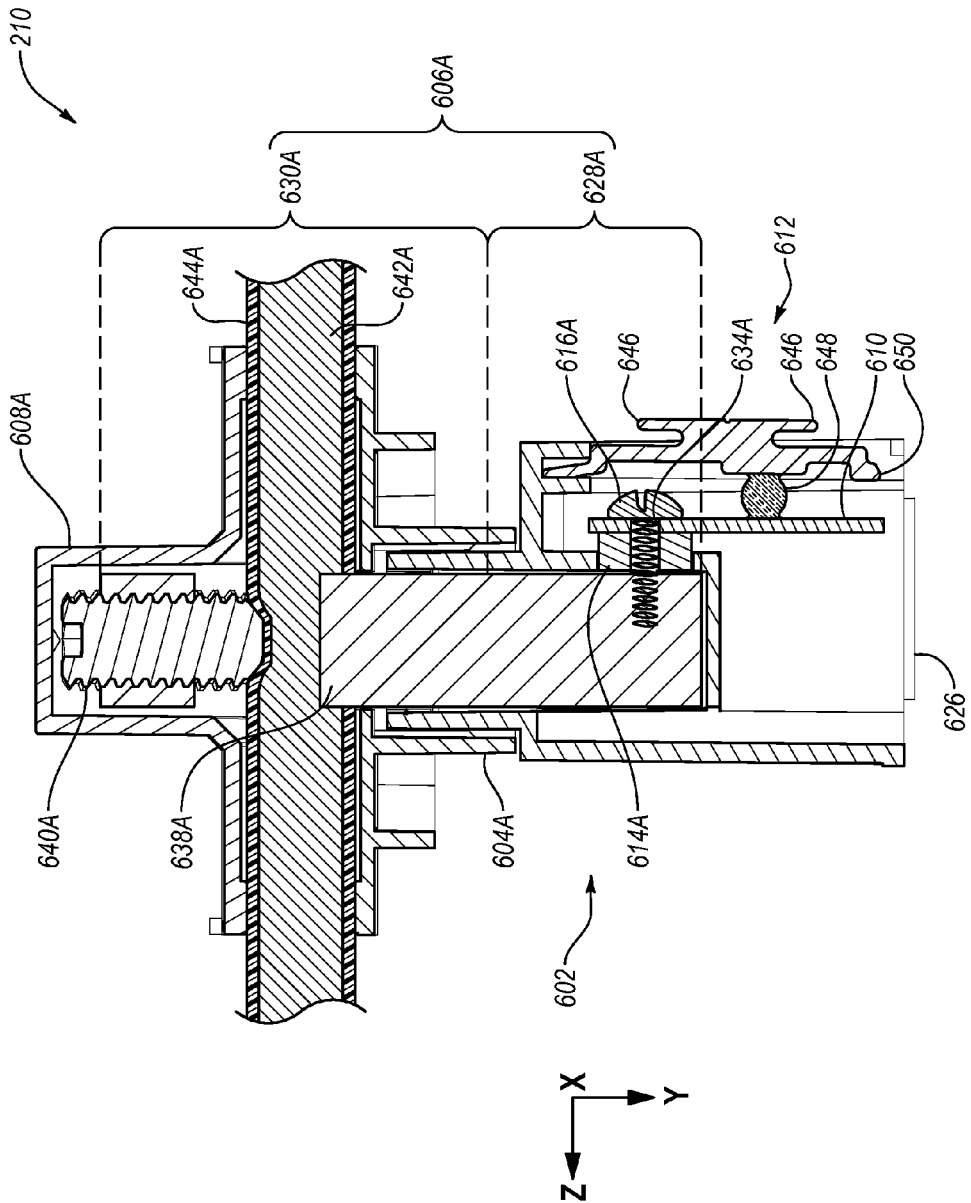
Figure 6D:
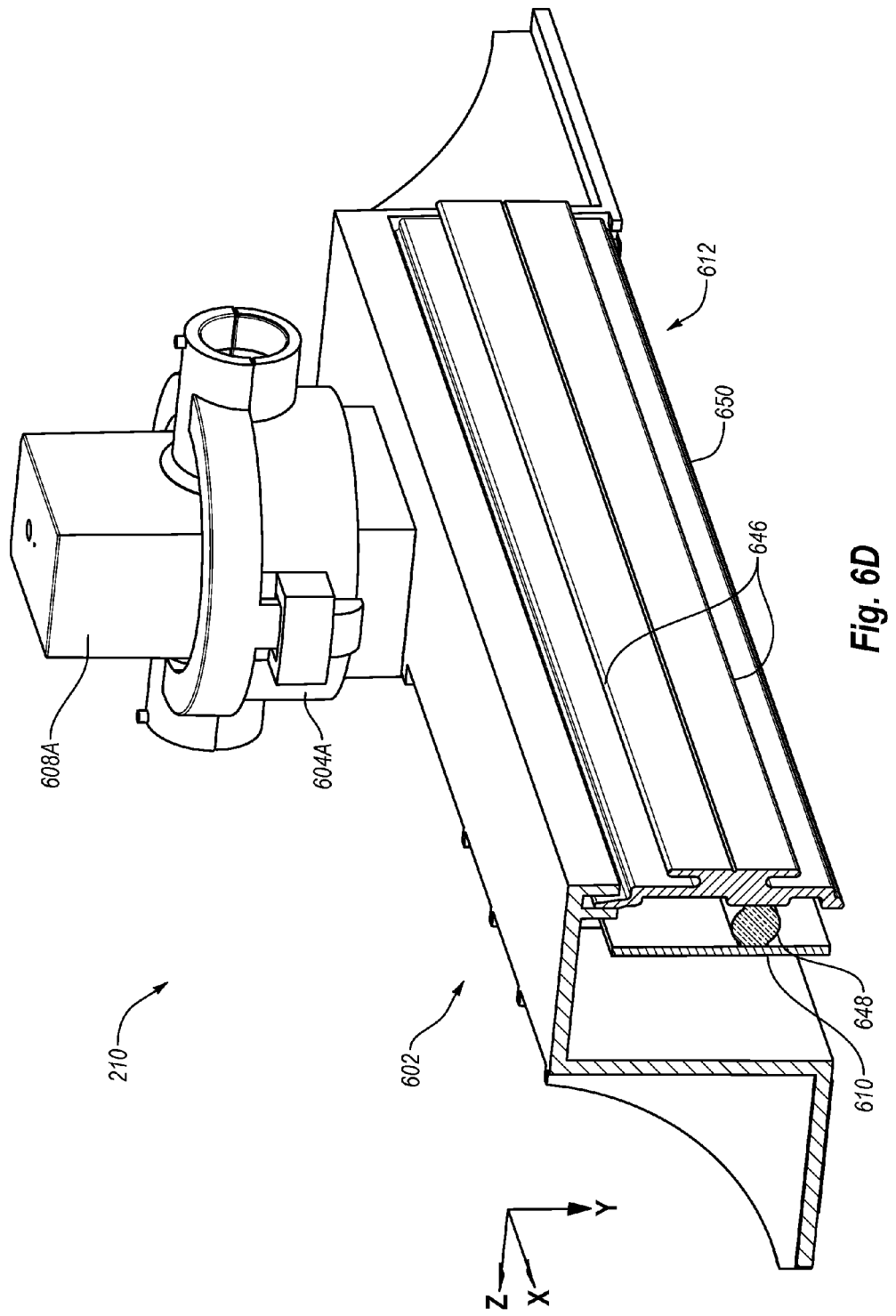

FIGS. 6A-6D illustrate an embodiment of the undermount assembly 210 of the PV module 200 of FIG. 2, arranged in accordance with at least some embodiments described herein. In more detail, FIG. 6A is an exploded view of the undermount assembly 210. FIG. 6B is a cross-sectional view of a portion of the undermount assembly 210 in a plane parallel to the XY plane. FIG. 6C is a cross-sectional view of the undermount assembly 210 in a plane parallel to the YZ plane. FIG. 6D is a cross-sectional perspective view of the undermount assembly 210.

Referring to FIG. 6A, the undermount assembly 210 includes a housing 602, two nests 604A, 604B (collectively "nests 604"), two risers 606A, 606B (collectively "risers 606"), two caps 608A, 608B (collectively "caps 608"), a circuit card 610, a cover 612, two washers 614A, 614B (collectively "washers 614"), and two screws 616A, 616B (collectively "screws 616").

The housing 602 includes an ultraviolet (UV) stabilized polymer such as, but not limited to, polymer, glass-filled polymer, mica-filled polymer, PET, polyoxymethylene (POM), or the like, including products sold by Dupont under the names Rynite and Delrin 527UV. The housing 602 includes a main body 618 and multiple feet 620A-620C (collectively "feet 620"). The main body 618 defines two slots 622A, 622B (collectively "slots 622"), aspects of which are described in more detail below.

The feet 620 extend from the main body 618 and are substantially coplanar in a plane parallel to the XZ plane. Each of the feet 620 includes one or more ribs or haunch stiffeners 624 to stabilize the main body 618 with respect to the feet 620. The undermount assembly 210 is mechanically coupled to the continuous backsheet 206 using an adhesive or tape 626 (FIG. 6B) disposed between the continuous backsheet 206 and each of the feet 620. Optionally, a sealant is placed, as necessary, between the housing 602 and the continuous backsheet 206 to protect against moisture ingress.

The risers 606 include electrically-conductive material(s) such as, but not limited to, metal or metal alloys including aluminum, plated aluminum, copper, BeSn (Beryllium Tin)-coated copper, or the like or any combination thereof. Moreover, the risers 606 may be machined, extruded, or formed in some other manner. Each of the risers 606 includes a base 628A, 628B and a C-shaped end 630A, 630B opposite the base 628A, 628B. Each base 628A, 628B defines a tapped or self-tapping hole (hereafter "tapped hole") 632A, 632B.

The nests 604 extend from a bottom surface (e.g., the negative Y surface) of the main body 618 of the housing 602. Each of the nests 604 may be a separate component from the main body 618 that is attached to the main body 618 as shown in the illustrated embodiment of FIGS. 6A-6D, or each of the nests 604 may be integral to the main body 618. The C-shaped end 630A, 630B of each of the risers 606 extends from and at least partially below (e.g., in the negative Y direction) the corresponding one of the nests 604.

Each of the two nests 604 defines a slot 633A, 633B (collectively "slots 633"). Each of the slots 633 in the nests 604 is in communication with the corresponding slot 622 of the housing 602. The riser 606A passes through the slot 633A in the nest 604A and through the slot 622A in the main body 618 as illustrated in FIG. 6C to electrically couple to the circuit card 610. In particular, and with combined reference to FIGS. 6A and 6C, the screw 616A passes through the washer 614A and through a through hole 634A defined in the circuit card 610 to threadably engage the tapped hole 632A of the riser 606A and secure the circuit card 610 to the riser 606A. Similarly, the riser 606B passes through the slot 633B in the nest 604B and through the slot 622B in the main body 618 as illustrated in FIG. 6B to electrically couple to the circuit card 610. In particular, the screw 616B passes through the washer 614B and through a through hole 634B defined in the circuit card 610 to threadably engage the tapped hole 632B of the riser 606B and secure the circuit card 610 to the riser 606B in the same manner illustrated for the riser 606A in FIG. 6C. In some embodiments, the riser 606A is electrically coupled to a positive terminal (FIG. 7) and the riser 606B is electrically coupled to a negative terminal (FIG. 7) of the circuit card 610.

Additional details regarding the riser 606B will now be described with respect to FIG. 6B, with the understanding that the riser 606A is similarly configured. The C-shaped end 630B includes a top 635 (or positive Y portion) and a bottom 636 (or negative Y portion). The top 635 includes one or more insulation-penetrating members 638B. The bottom 636 includes a clamping member 640B in the form of a threaded set screw. The riser 606A similarly includes one or more insulation-penetrating members 638A and a clamping member 640A, as illustrated in FIG. 6C.

FIG. 6B additionally illustrates a wire 642B having an insulating jacket 644B, the wire 642B being disposed within the C-shaped end 630B of the riser 606B. FIG. 6C similarly illustrates a wire 642A having an insulating jacket 644A, the wire 642A being disposed within the C-shaped end 630A of the riser 606A. The wires 642A, 642B (collectively "wires 642") collectively make up a module-to-module bus, such as the module-to-module bus 104 of FIG. 1, for electrically interconnecting the PV module 200 in parallel to other PV modules 200. Each of the wires 642 may be large-area wires.

For example, each of the wires 642 may have a cross-sectional area greater than or equal to about 15 mm². Alternately or additionally, each of the wires 642 may have a cross-sectional area in a range from about 15 mm² to about 50 mm².

A method of connecting each of the risers 606 to the wires 642 making up the module-to-module bus will now be described with respect to FIGS. 6B-6C. Each of the wires 642A, 642B is placed in the C-shaped end 630A, 630B of the corresponding riser 606A, 606B without stripping the insulating jacket 644A, 644B from the wire 642A, 642B during installation. Each clamping member 640A, 640B is then clamped during installation to clamp the corresponding wire 642A, 642B against the corresponding insulation-penetrating members 638A, 638B. The clamping members 640A, 640B may be clamped by screwing the clamping members 640A, 640B to cause the clamping members 640A, 640B to advance towards the insulation-penetrating members 638A, 638B. The clamping of the wires 642A, 642B against the insulation-penetrating members 638A, 638B causes the insulation-penetrating members 638A, 638B to penetrate the insulating jacket 644A, 644B of the corresponding wire 642A, 642B and directly contact the corresponding wire 642A, 642B, thereby electrically coupling each wire 642A, 642B to the corresponding riser 606A, 606B. Although not shown in FIGS. 6A-6B, in some embodiments, the clamping members 640A, 640B penetrate the insulating jacket 644A, 644B and directly contact the corresponding wire 642A, 642B as well, thereby increasing the direct contact to the wires 642A, 642B.

The above-described method of connecting the risers 606 to the wires 642 allows the electrical connections to the wires 642 to be made without severing the wires 642 and without stripping the insulating jackets 644. As such, the wires 642 making up the module-to-module bus in a PV system, such as the PV system 100, can be continuous. Additionally, the connections can be made without taking the time to strip the insulating jackets 644.

With reference to FIGS. 6A-6C, each of the caps 608 is attached to a corresponding one of the nests 604 after the wires 642 are connected to the risers 606. Attaching the cap 608A to the riser 606A encloses the C-shaped end 630A and a portion of the wire 642A where the insulating jacket 644A has been penetrated by the insulation-penetrating members 638A within the nest 604A and the cap 608A to protect the connection between the C-shaped end 630A and the wire 642A from environmental contaminants such as moisture. Similarly, attaching the cap 608B to the riser 606B encloses the C-shaped end 630B and a portion of the wire 642B where the insulating jacket 644B has been penetrated by the insulation-penetrating members 638B within the nest 604B and the cap 608B to protect the connection between the C-shaped end 630B and the wire 642B from environmental contaminants. The caps 608 may be snap-on caps and/or may be filled with a moisture-repelling and/or electrically-insulating substance such as silicone or protective grease to further protect the connections between the risers 606 and the wires 642.

With combined reference to FIGS. 6C-6D, aspects of the cover 612 will be described. The cover 612 may include metal or metal alloys or other thermally-conductive material(s). In some embodiments, the cover 612 is black for enhanced thermal transfer. In the illustrated embodiment, the cover 612 is shaped with various protrusions 646 and/or other features that maximize a surface area of the cover 612 that is externally exposed. A bead of material 648 is sandwiched between the circuit card 610 and the cover 612. The material 648 is thermally conducting and electrically insulating in some embodiments. When fully assembled with the PV module 200, a lower edge 650 of the cover 612 may be in direct contact with or close proximity to (e.g., less than about 8 mm) the frame 208 with an optional bead of thermally-conductive silicone or other material therebetween. Accordingly, thermal energy may be dissipated away from the circuit card 610 by transferring through the material 648 to the cover 612 to be dissipated directly from the cover 612 into the environment, and/or thermal energy may be transferred from the cover 612 to the frame 208 to be dissipated directly from the frame 208 into the environment. Although not shown in FIGS. 6C-6D, one or more spacers may be provided between the circuit card 610 and the housing 602.

In some embodiments, each of the risers 606 further includes one or more tabs 652 (FIG. 6B only). The tabs 652 on each riser 606 extend outward from the riser 606 in both the positive X and negative X directions. In general, the tabs 652 prevent the nests 604 from being removed from the undermount assembly 210 after the risers 606 have been coupled to the circuit card 610. For example, as shown in FIG. 6B, the nest 604B includes tabs 654 that extend inward (e.g., in the positive X and negative X directions) toward the riser 606B. The dimensions of the riser 606B and the nest 604B are such that the tabs 652 of the riser 606B acting against the tabs 654 of the nest 604B confine the nest in the negative Y direction to the extent the riser 606B is also confined in the negative Y direction as may occur after the riser 606B has been secured to the circuit card 610. Although not shown in FIG. 6C, the nest 604A similarly includes tabs such that the nest 604A is confined in the negative Y direction to the same extent the riser 606A is also confined in the negative Y direction.

V. Circuit Card

Figure 7:
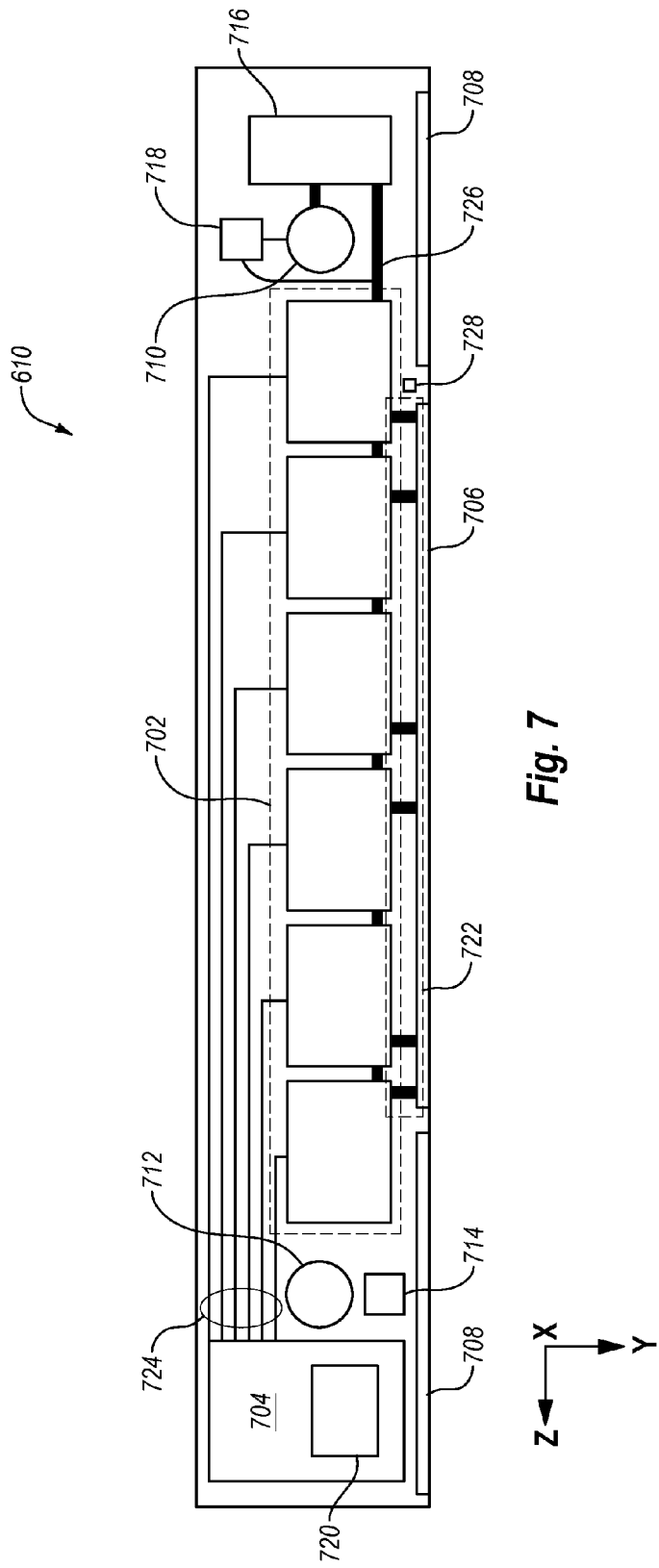
FIG. 7 illustrates an example embodiment of a circuit card included in the undermount assembly of FIGS. 6A-6D.

FIG. 7 illustrates an example embodiment of the circuit card 610 of FIGS. 6A-6D, arranged in accordance with at least some embodiments described herein. The circuit card includes multiple converters 702 disposed thereon. The converters 702 may correspond to the converters 116 of FIG. 1. Details regarding the converters 116 and other converters have already been described above, which details may also apply to the converters 702. The circuit card 610 additionally includes a digital controller 704 disposed thereon, a positive connector 706, one or more negative connectors 708, a positive terminal 710, and a negative terminal 712. Optionally, the circuit card 610 further includes measurement circuitry 714, a protection relay 716, an opto-relay 718, and a radio frequency (RF)-emitting device 720.

Each of the converters 702 is independently electrically coupled to the positive connector 706 via a corresponding one of multiple fuses 722. With combined reference to FIGS. 5A and 7, the tab 508A of the internal bus strip 508 extends through the slot 502 in the continuous backsheet 206 and is soldered or otherwise electrically coupled to the positive connector 706 such that the array of PV cells 404 of the PV module 200 is electrically coupled through the serial interconnects 412B, the internal bus strip 508/tab 508A, the positive connector 706 and the fuses 722 to each of the converters 702. As such, energy generated by each of the PV cells 404 is receivable at any of the converters 702. In particular, the energy collectively generated by the array of PV cells 404 is output onto the internal bus strip 508 and can then travel through the tab 508A and the positive connector 706 to any of the converters 702 via a corresponding one of the fuses 722.

The array of PV cells 404 in some embodiments collectively generates about 25 amps to 50 amps of current. The tab 508A and the positive connector 706 are generally dimensioned such that a current-carrying capacity thereof from the PV cells 404 to the converters 702 is significantly greater than a maximum expected current collectively generated by the array of PV cells 404. For example, the current-carrying capacity of the tab 508A and of the positive connector 706 may be about 4-8 times greater than the maximum expected current collectively generated by the array of PV cells 404. Where the maximum expected current is 50 amps, for example, the current-carrying capacity of the tab 508A and of the positive connector 706 may be about 200 amps to about 400 amps. As such, even though the electrical connection between the PV cells 404 and the converters 702 includes a single tab 508A and a single positive connector 706, the electrical connection between the PV cells 404 and the converters 702 is nevertheless redundant since any discrete failure along the length (e.g., the X direction) of the tab 508A and/or the positive connector 706 will not prevent current from flowing through the remaining connection area of the tab 508A and the positive connector 706. Indeed, where the current-carrying capacity of the tab 508A and of the positive connector 706 is only 4 times greater than the maximum expected current collectively generated by the array of PV cells 404, the tab 508A and/or the positive connector 706 could fail along 75% of their length without restricting current flow from the PV cells 404 to the converters 702.

With combined reference to FIGS. 5B and 7, each of the tabs 504 extends from the continuous backsheet 206 and is soldered or otherwise electrically coupled to a corresponding one of the negative connectors 708 such that the circuit card 610 is grounded through the negative connectors 708 and the tabs 504 to the continuous backsheet 206. As with the tab 508A and the positive connector 706, an aggregate current carrying capacity of tabs 504 and the negative connectors 708 may be 4-8 times greater than the maximum expected current returned through the continuous backsheet 206 to provide redundancy.

The digital controller 704 is communicatively coupled to each of the converters 702 via corresponding paired enable and pulse width modulation (PWM) lines 724. The converters 702 are each controlled independently of the others by the digital controller 704 via the paired enable and PWM lines 724. In some embodiments, the digital controller 704 is powered solely by energy generated by the PV module 200, or more particularly, by energy generated by the PV cells 404 of the PV module 200. During non-monotonically increasing or decreasing illumination conditions of the PV module 200, a discrete or integrated brown-out circuit (not shown) may be used to ensure the digital controller 704 is not corrupted.

In operation, energy generated by the PV cells 404 flows from the positive connector 706 through one of the fuses 722 into a corresponding one of the converters 702, which outputs energy with a relatively lower current and higher voltage onto an output bus 726 of the circuit card 610. Any number of converters 702 from zero up to all of the converters 702 may operate at a given time.

The output bus 726 is electrically coupled to outputs of each of the converters 702 and is thus common to all of the converters 702. The output bus 726 may be at about 48 volts during operation. The output bus 726 is coupled through the protection relay 716 to the positive terminal 710. The protection relay 716 may include a mechanical relay, a solid state relay, or other suitable relay and in some embodiments defaults open. When the protection relay 716 is closed, energy on the output bus 726 can be output through the positive terminal 710 (and the riser 606A of FIG. 6C) to a module-to-module bus (including the wire 642A of FIG. 6C). Opening the protection relay 716 electrically disconnects the output bus 726 from the module-to-module bus.

The opto-relay 718 is coupled to the output bus 726 and the positive terminal 710. The opto-relay 718 is used to measure positive voltage on the module-to-module bus for zero-current relay switching and also to recharge a capacitor bank, e.g., by feeding current into the module-to-module bus, for capacitance-only systems (e.g., no storage devices).

The measurement circuitry 714 detects current coming into the PV module 200 via the negative terminal 712 from the module-to-module bus. In other embodiments, the measurement circuitry 714 detects current going out of the PV module 200 via the positive terminal 710. In some embodiments, the measurement circuitry 714 measures current input (or current output) from (or to) the module-to-module bus at the negative terminal 712 (or the positive terminal 710) while the digital controller 704 estimates current output (or current input) to (or from) the module-to-module bus at the positive terminal 710 (or the negative terminal 712).

In some embodiments, the digital controller 704 estimates the current output (or current input) based on one or more of: the number of operating converters 702, PWM values of the operating converters 702, voltage collectively generated by the PV cells 404, output voltage to the module-to-module bus, combined with a look-up table to correct for some errors. The measurement from the measurement circuit 714 is received at the digital controller 704 and compared with the estimate to monitor current offset between the input and output. If the input and output do not match within a specific limit or percentage of the output, the digital controller 704 can switch off the operating converters 702 to discontinue sending power onto the module-to-module bus. Alternately or additionally, the digital controller 704 may monitor the input and/or output current and may limit current flow in the case where the output current exceeds a preset limit. In these and other embodiments, the measurement circuitry 714 may include a resistor and/or an op-amp.

During operation, one or more of the converters 702 may fail. For example, one or more of the converters 702 may experience a finite resistance short failure. In these and other embodiments, the digital controller 704 may temporarily disable the other converters 702 to temporarily route all current collectively generated by the PV cells 404 through the failed converter 702 until the corresponding fuse 722 opens. In response to the corresponding fuse 722 opening, the digital controller 704 may resume normal operation using at least some of the remaining converters 702 by enabling the corresponding converters 702.

As illustrated in FIG. 7, the converters 702 are disposed in a line on the circuit card 610. The converters 702 in some embodiments have a spacing of less than 3 mm between adjacent converters 702. FIG. 7 additionally illustrates that the converters 702 are generally disposed near the positive connector 706. In some embodiments, each of the converters 702 is disposed within a range of about 2 mm to about 10 mm from the positive connector 706. Due to the proximity of the converters 702 to the positive connector 706, high current losses from the positive connector 706 to each of the converters 702 may be minimized compared to configurations where the converters 702 are located further from the positive connector 706.

The converters 702 in some embodiments are operated offset from each other. For example, the six converters 702 of FIG. 7 may be operated in three pairs, each operating pair operating offset from (e.g., out of phase with) the other operating pairs. In some embodiments, the operating pairs are offset by 120 degrees from each other. The two converters within each operating pair may be operated at 180 degrees out of phase with each other. In other embodiments, the circuit card 610 may include any desired number of converters 706 which may be divided into any desired number of operating pairs offset by any desired phase offset, where the two converters within each operating pair are operated at any desired phase offset from each other.

The RF-emitting device 720 is communicatively coupled to the digital controller 704. The digital controller 704 is configured to operate the RF-emitting device 720 to transmit information to or receive information from other PV modules 200 in a PV system including multiple PV modules 200, such as the PV system 100 of FIG. 1. Alternately or additionally, the digital controller 704 may be configured to operate the RF-emitting device 720 to transmit information to or receive information from a data collection device included in the PV system. In some embodiments, if one of the PV modules 200 is out of direct transmission distance from the data collection device, for instance, the information from the PV module 200 may be transmitted to the data collection device by essentially operating one or more intermediary PV modules 200 as relay nodes. Thus, each PV module 200 may transmit to or receive data from other PV modules 200 and/or the data collection device.

Optionally, the circuit card 610 further includes an optical signal source 728 communicatively coupled to the digital controller 704 and mounted to the circuit card 610 near the top (e.g., positive Y side) of the circuit card 610 such that optical signals emitted by the optical signal source 728 are visible from the front of the PV module 200. The optical signal source 728 may include a 90-degree surface mount light-emitting diode (LED), a surface mount laser, or other suitable optical signal source.

The PV module 200 includes various intervening layers between the optical signal source 728 and the front of the PV module 200, such as the continuous backsheet 206, the buffer layer 408, the PV cells 404 and the adhesive layer 406. A hole may be formed through one or more of the intervening layers so that optical signals emitted by the optical signal source are visible through the intervening layers from the front of the PV module 200. Alternately or additionally, some or all of the intervening layers may be translucent and/or may already include an opening formed therein—such as the slot 502 formed in the continuous backsheet 206—such that optical signals emitted by the optical signal source 728 are visible from the front of the PV module 200 without forming a hole in some or all of the intervening layers.

In some embodiments, the digital controller 704 operates the optical signal source 728 to emit optical signals comprising status information. The emitted optical signals may include visually-recognizable (e.g., by a human) patterns that convey the status information. The status information may include power and fault codes and is used in some embodiments for debugging, detecting failures, confirmation location of panels, or other purposes.

Alternately or additionally, the emitted optical signals include packets of bits that may be interpreted by a computing device coupled to a photodiode or other optical receiver. The packets of bits include more detailed status information than might otherwise be communicated in by the visually-recognizable patterns, such as a module serial ID for the PV module 200, full fault logs, accumulated energy production for the PV module 200, a temperature of the PV module 200, a number of on/off cycles of the PV module 200, or the like or any combination thereof.

Figure 8:
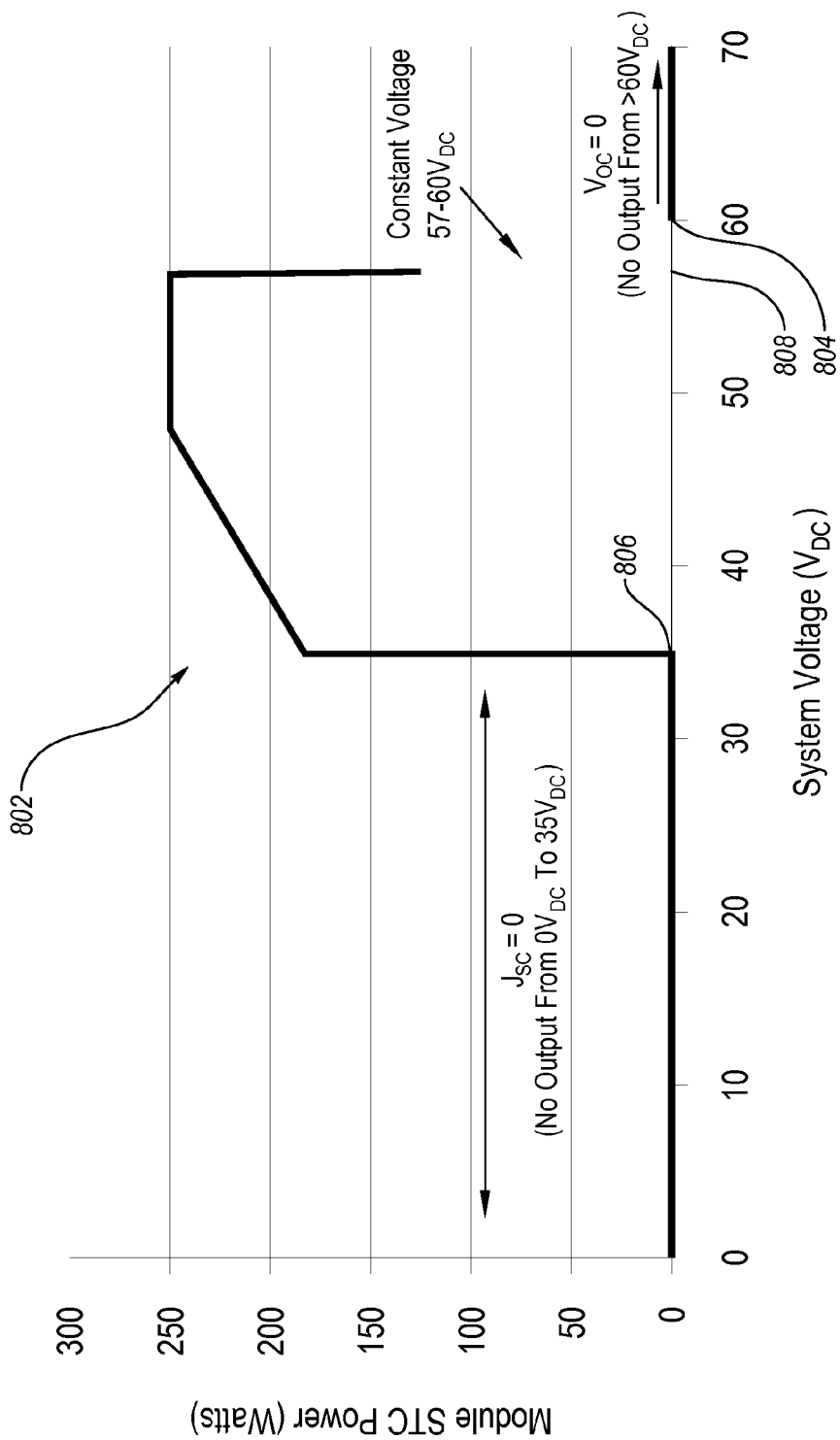
FIG. 8 illustrates an example power/voltage curve for the PV module of FIG. 2.

FIG. 8 illustrates an example power/voltage curve 802 for the PV module 200 of FIG. 2, arranged in accordance with at least some embodiments described herein. Example operation of the PV module 200 will now be described with combined reference to FIGS. 2-8. The circuit card 610, including the digital controller 704, is powered directly by the energy generated by the PV module 200 and not from an external supply. As such, the circuit card 610 is not powered in the absence of illumination, such as at night. Under sufficient illumination, the PV cells 404 generate sufficient voltage for the digital controller 704 to begin operating.

The first operation performed by the digital controller 704 is to perform a series of checks to ensure safe module operation. For example, the digital controller 704 checks the voltage on the module-to-module bus by controlling the opto-relay 718 to measure the voltage on the module-to-module bus. If the voltage is above a maximum threshold 804, the digital controller 704 does not allow energy to be output to the module-to module bus by causing the protection relay 716 to open or remain open (as previously mentioned, the protection relay 716 may default open). Instead, any energy generated by the PV cells 404 and received at the converters 702 may be shunted back into the PV cells 404 through the continuous backsheet 206 while the digital controller 704 continues monitoring the voltage on the module-to-module bus. The maximum threshold 804 is 60 volts in the example of FIG. 8.

When the voltage on the module-to-module bus is less than a minimum threshold 806, such as 35 volts in the example of FIG. 8, the digital controller 704 controls the opto-relay 718 to trickle charge current from the output bus 726 to the module-to-module bus to determine whether a capacitive element is attached to the module-to-module bus. If the digital controller 704 determines that a capacitive element is attached to the module-to-module bus, the digital controller 704 continues to trickle charge current through the opto-relay 718 to the module-to-module bus until the voltage on the module-to-module bus rises above the minimum threshold 806.

When the voltage on the module-to-module bus rises above the minimum threshold 806, the digital controller 704 closes the protection relay 716 to ensure zero current switching. The digital controller 704 operates the converters 702 in a maximum current mode when the voltage on the module-to-module bus is between the minimum threshold 806 and an intermediate threshold 808 greater than the minimum threshold 806. The intermediate threshold 808 is 57 volts in the example of FIG. 8. The digital controller 704 operates the converters 702 in a constant voltage mode when the voltage on the module-to-module bus is between the intermediate threshold 808 and the maximum threshold 804 and opens the protection relay 716 when the voltage on the module-to-module bus rises above the maximum threshold 804 or falls below the minimum threshold 806.

If the voltage on the module-to-module bus is already greater than the minimum threshold 806 and less than the intermediate threshold 808 when the digital controller 704 first measures the voltage, the digital controller 704 charges up (e.g., operates) the converters 702 until the voltage on the output bus 726 matches the voltage on the module-to-module bus before closing the protection relay 716 to ensure zero current switching of the protection relay 716. As already described above, the digital controller 704 will then operate the converters 702 in maximum current mode or constant voltage mode, or will open the protection relay 716, depending on the voltage on the module-to-module bus.

Accordingly, the protection relay 716 enables a soft start control where the PV module 200 is isolated from the voltage on the module-to-module bus until one or more of the converters 702 are charged so that the voltage on the output bus 726 matches the voltage on the module-to-module bus before closing the protection relay 716. In these and other embodiments, the opto-relay 718 is a bypass circuit around the protection relay 716 that allows measurement of the external voltage on the module-to-module bus to ensure that the soft start is balanced, and to allow some small current to be fed into the module-to-module bus to assist in charging a capacitive element on the module-to-module bus in the event an energy storage device is not coupled thereto.

In a PV system, such as the PV system 100 of FIG. 1, that includes multiple PV modules 200, each of the PV modules 200 operates independently of the others depending only on the voltage on the module-to-module bus as described herein, ensuring redundancy by eliminating dependencies on other PV modules 200.

Maximum current mode includes operating any number, from one to all, of the converters 702 so as to produce a maximum current output on the output bus 726. The number of converters 702 operated at any given time depends on the amount of available current from the PV cells 404, which is determined by changing PWM values of any single operating converter 702 and observing the resulting voltage change and power. If the voltage change is minimal and the power increases, a maximum peak power algorithm is executed, as described in more detail below. As the maximum peak power algorithm reaches optimum PWM values for the converters 702, additional converters 702 may be enabled to continue taking (and outputting) more power. If the power decreases and the PWM values for the operating converters 702 fall below a threshold, one of the operating converters 702 may be disabled.

If one of the operating converters 702 experiences a failure, the digital controller 704 may identify the failed converter 702 in memory. If the converter 702 fails short, the digital controller 704 may temporarily disable the other operating converters 702 and temporarily route all current through the failed converter 702 and its fuse 722 to open the fuse 722 as already explained above.

VI. Converters

Figure 9:
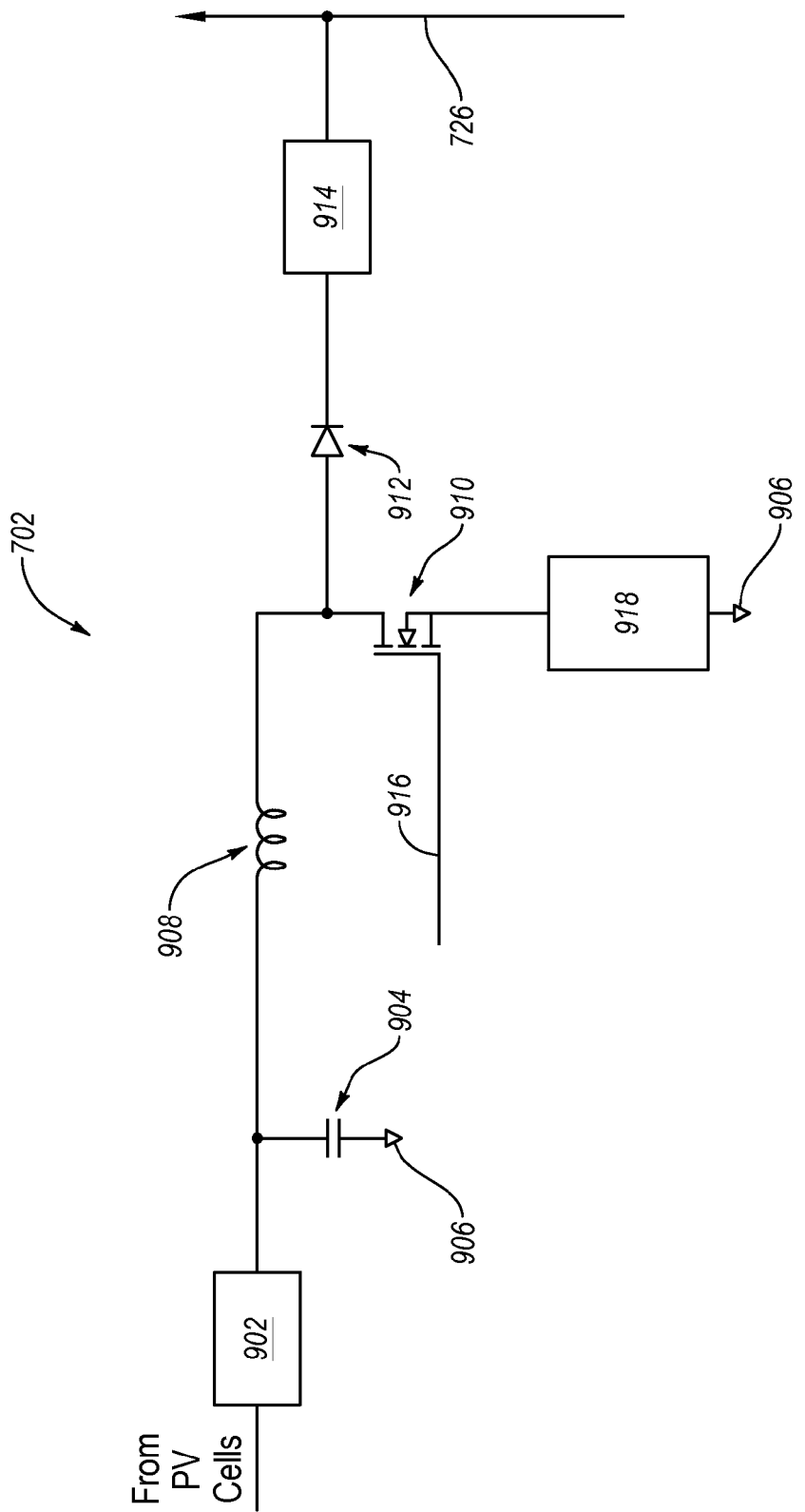
FIG. 9 is a schematic diagram of an embodiment of a converter included on the circuit card of FIG. 7.

FIG. 9 is a schematic diagram of an embodiment of one of the converters 702 of FIG. 7, arranged in accordance with at least some embodiments described herein. Each of the converters 702 may be similarly configured. The converter 702 illustrated in FIG. 9 is merely one example of a converter that can be employed according to some embodiments and should not be construed to limit the invention in any way.

As shown in FIG. 9, the converter 702 includes an input 902, a capacitor 904 coupled to the input 902 and to ground 906, an inductor 908 coupled to the input 902 and to the capacitor 904, a switch 910 coupled to the inductor 908, a diode 912 coupled to the inductor 908 and to the switch 910, an output 914 coupled to the diode 912, a control line 916 coupled to the switch 910, and one or more measurement circuits 918 coupled between the converter 702 and ground 906.

With combined reference to FIGS. 2-9, the input 902 is electrically coupled to the positive connector 706 through a corresponding fuse 722. The ground 906 is electrically coupled to the continuous backsheet 206 through one of the negative connectors 708 and a corresponding one of the tabs 504. The output 914 is electrically coupled to the output bus 726. The control line 916 is communicatively coupled to the digital controller 704 and may correspond to one of the paired enable and PWM lines 724.

The digital controller 704 provides, via the control line 916, a PWM signal to the switch 910 that controls the switching frequency and/or duty cycle of the converter 702. Alternately or additionally, the PWM signal controls the phasing of the converter 702 relative to the phasing of other converters 702 on the circuit card 610.

The switch 910 may include a field-effect transistor ("FET"), a metal-oxide-semiconductor FET ("MOSFET"), an insulated-gate bipolar transistor ("IGBT"), a bipolar junction transistor ("BJT"), or other suitable switch. The diode 912 may include a Schottky rectifier, or other suitable diode.

The measurement circuit 918 includes one or more resistors and is employed to measure certain operating parameters of the converter 702. For instance, the measurement circuit 918 can measure the maximum current buildup per switching cycle in the inductor 908 in order to maintain maximum peak power. Alternately or additionally, the measurement circuit 918 can measure the charging rate of the inductor 908, the input voltage of the converter 702, the output voltage of the converter 702, or the like or any combination thereof.

In operation, the converter 702 receives energy generated by any of the PV cells 404 at the input 902 and converts it to have a relatively higher voltage (referred to as the "step-up voltage") and a lower current by switching itself on and off via the switch 910. In the "on" state, the switch 910 is closed such that the current flowing through the inductor 908 increases and returns to ground 906 through the switch 910 and the measurement circuit 918. In the "off" state, the switch 910 is open such that the current flowing through the inductor 908 decreases, flowing through the diode 912 and the output 914 to the output bus 726.

In the "on" state of the converter 702, the voltage at the output 914 is about 0 volts. In the "off" state, the voltage at the output 914 depends on the rate of change of current through the inductor 908, rather than on the input voltage at the input 902. In turn, the rate of change of current through the inductor 908 depends on the inductance of the inductor 908. Accordingly, the step-up voltage at the output 914 depends on the inductance of the inductor 908. Alternately or additionally, the step-up voltage at the output 914 depends on the switching frequency of the switch 910 and/or the duty cycle of the switch 910.

In a continuous conduction mode, the current through the inductor 908 never reaches 0 amps. By cycling the converter 702 on and off in or near continuous conduction mode, the converter 702 produces conditioned power (e.g., power having the step-up voltage) at the output 914 while maximizing efficiency and minimizing peak current in the converter 702. Alternately or additionally, the converter 702 may be operated near continuous conduction mode by limiting the duty cycle D of the converter 702 to $[(V\_out-V\_in)/V\_out-0.05] < D < 0.75$, where V_out and V_in are the output voltage and the input voltage of the converter 702 and may be measured by the measurement circuit 918.

In this and other embodiments, the switch 910 is operated via the control line 916. In particular, the digital controller 704 sends signals over the control line 916 to open and close the switch 910 at a desired frequency and duty cycle. Because each of the step-up voltage and the impedance of the converter 702 depend on the frequency and the duty cycle of the switching process, the digital controller 704 can set the frequency and/or duty cycle at a predetermined frequency and/or duty cycle to optimize the step-up voltage and the impedance of the converter 702. Thus, any individual converter 702 on the circuit card 610 may only be partially used in both duty cycle and frequency and may be part of a dynamic load-leveling cycle.

In some embodiments, the increasing and decreasing current through the inductor 908 can cause periodic variations in the amplitude of the input current and/or the output current of the converter 702. These periodic variations in the current amplitude are also known as current ripple. Current ripple at the input 902 of the converter 702 can cause the impedance of the converter 702 to vary as a function of the current ripple, making it difficult for the converter 702 to maintain maximum peak power. Current ripple at the output of the converter 702 can result in noise on the output bus 726 that may negatively affect a load coupled to the output bus 726.

However, current ripple can be substantially reduced at the input and output of the circuit card 610 as a whole by operating the converters 702 out of phase with each other. When the converters 702 are operating out of phase with each other, the amplitude of current ripple in one of the converters 702 may be increasing while the amplitude of current ripple in another of the converters 702 may be decreasing. The cumulative effect of the out-of-phase operation of the converters 702 averages out the current ripple at the input and output of the circuit card 610 as a whole.

As mentioned above, the maximum value of the current buildup and/or the charging rate of the inductor 908 may be used by the converters 702 in maintaining peak power of the PV module 200. Maintaining peak power can maximize the unconditioned power output of the array of PV cells 404, and consequently of the conditioned power output to the module-to-module bus. In general, maintaining peak power includes (1) identifying a peak power point at which power output of the array of PV cells 404 is maximized and (2) dynamically varying the impedance of the converters 702 to effectively match the impedance of a load such that the voltage across the array of PV cells 404 is substantially equal to the identified peak power point. Moreover, as explained above with respect to FIG. 1, the load coupled to the module-to-module bus may be optimized to operate over a very narrow voltage range for maximum efficiency. Details of an example peak power algorithm are disclosed in more detail in U.S. patent application Ser. No. 12/357,260, filed Jan. 21, 2009, which application is herein incorporated by reference in its entirety.

The embodiments described herein may include the use of a special purpose or general purpose computer, including various computer hardware or software modules, as discussed in greater detail below.

Embodiments within the scope of the present invention also include computer-readable media for carrying or having computer-executable instructions or data structures stored thereon. Such computer-readable media can be any available media that can be accessed by a general purpose or special purpose computer. By way of example, and not limitation, such computer-readable media can include tangible computer-readable storage media including RAM, ROM, EEPROM, CD-ROM or other optical disk storage, magnetic disk storage or other magnetic storage devices, or any other storage medium which can be used to carry or store desired program code means in the form of computer-executable instructions or data structures and which can be accessed by a general purpose or special purpose computer. Combinations of the above should also be included within the scope of computer-readable media.

Computer-executable instructions comprise, for example, instructions and data which cause a general purpose computer, special purpose computer, or special purpose processing device to perform a certain function or group of functions. Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

As used herein, the term "module" or "component" can refer to software objects or routines that execute on the computing system. The different components, modules, engines, and services described herein may be implemented as objects or processes that execute on the computing system (e.g., as separate threads). While the system and methods described herein are preferably implemented in software, implementations in hardware or a combination of software and hardware are also possible and contemplated. In this description, a "computing entity" may be any computing system as previously defined herein, or any module or combination of modulates running on a computing system.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. A photovoltaic system comprising:
 a plurality of photovoltaic modules, each photovoltaic module defining a first end and a second end opposite the first end, wherein each photovoltaic module comprises:
 a plurality of photovoltaic cells, wherein energy generated by each photovoltaic cell has multiple paths through the plurality of photovoltaic cells to the second end; and
 a plurality of converters electrically coupled to the plurality of photovoltaic cells at the second end such that energy generated by each photovoltaic cell is receivable at any of the plurality of converters; and
 a module-to-module bus electrically coupled to each of the plurality of photovoltaic modules, the module-to-module bus having an output, wherein energy generated by each photovoltaic module is receivable at the output independent of any other of the plurality of photovoltaic modules,
 wherein:
 each of the plurality of photovoltaic modules further comprises:
 a circuit card mechanically coupled to the second end; and
 a digital controller disposed on the circuit card;
 the plurality of converters are disposed on the circuit card; and
 the digital controller of each of the photovoltaic modules is configured to:
 trickle charge current onto the module-to-module bus when a voltage on the module-to-module bus is less than a minimum threshold to determine whether a capacitive element is attached to the module-to-module bus;
 in response to determining that the capacitive element is attached to the module-to-module bus, continue to trickle charge current onto the module-to-module bus until the voltage on the module-to-module bus rises above the minimum threshold;
 close a protection relay when the voltage on the module-to-module bus rises above the minimum threshold to ensure zero current switching, the protection relay being electrically coupled between the module-to-module bus and an output bus of the circuit card, the output bus being electrically coupled to outputs of each of the plurality of converters;
 operate the plurality of converters in a maximum current mode when the voltage on the module-to-module bus is between the minimum threshold and an intermediate threshold greater than the minimum threshold;
 operate the plurality of converters in a constant voltage mode when the voltage on the module-to-module bus is between the intermediate threshold and a maximum threshold greater than the minimum threshold; and open the protection relay when the voltage on the module-to-module bus rises above the maximum threshold or falls below the minimum threshold.

2. The photovoltaic system of claim 1, wherein:
the plurality of photovoltaic cells are arranged in a plurality of rows, wherein the plurality of rows are electrically coupled in series;
each of the plurality of photovoltaic modules further comprises a plurality of conductive row strips electrically coupling the photovoltaic cells in each row to each other in parallel; and
the multiple paths through the plurality of photovoltaic cells to the second end include the plurality of conductive row strips such that generated current can flow, via the plurality of conductive row strips, around photovoltaic cells with low performance and/or low illumination and through photovoltaic cells with relatively higher performance and/or higher illumination to the second end.

3. The photovoltaic system of claim 1, wherein:
each of the plurality of photovoltaic modules further comprises a continuous backsheet, the continuous backsheet comprising a ground plane for the plurality of photovoltaic cells;
the continuous backsheet is electrically coupled between a first subset of the plurality of photovoltaic cells at the first end and a second subset of the plurality of photovoltaic cells at the second end;
a first end connection between the continuous backsheet and the first subset of the plurality of photovoltaic cells at the first end comprises an anode of the photovoltaic module;
a second end connection between the plurality of converters and the second subset of the plurality of photovoltaic cells at the second end comprises a cathode of the photovoltaic module; and
the continuous backsheet is configured to carry module return current from the cathode to the anode.

4. The photovoltaic system of claim 3, wherein:
the plurality of photovoltaic cells are arranged in a plurality of rows, wherein the plurality of rows are electrically coupled in series, and the plurality of rows includes a first row that includes the first subset of the plurality of photovoltaic cells, and a last row that includes the second subset of the plurality of photovoltaic cells; and
the first end connection comprises:
a ground strip electrically and mechanically coupled to the continuous backsheet at the first end; and
a plurality of serial interconnects electrically and mechanically coupling each photovoltaic cell in the first row to the ground strip.

5. The photovoltaic system of claim 3, wherein the circuit card of each of the plurality of photovoltaic modules further comprises a positive connector and a negative connector, and wherein each of the plurality of photovoltaic modules further comprises:
an internal bus strip extending along a width of each corresponding photovoltaic module, wherein:
the internal bus strip is coupled to a cathode of each of the photovoltaic cells in the second subset of the plurality of photovoltaic cells; and
the internal bus strip includes a tab extending through a slot formed in the continuous backsheet to the positive connector of the circuit card, the tab electrically coupling the internal bus strip to the positive connector of the circuit card; and
one or more tabs extending from the continuous backsheet to the negative connector of the circuit card, the one or more tabs electrically coupling the continuous backsheet to the negative connector of the circuit card.

6. The photovoltaic system of claim 5, wherein the one or more tabs extending from the continuous backsheet ground the circuit card to the continuous backsheet, the one or more tabs including:
an integral tab integrally formed from the continuous backsheet and extending in a plane substantially normal to a plane defined by the continuous backsheet; or
a discrete tab mechanically and electrically coupled to the continuous backsheet and extending in a plane substantially normal to the plane defined by the continuous backsheet.

7. The photovoltaic system of claim 1, wherein the plurality of converters are each controlled independently of the others by the digital controller via paired enable and pulse width modulation (PWM) lines from the digital controller to each of the plurality of converters.

8. The photovoltaic system of claim 1, wherein:
the plurality of converters for each of the plurality of photovoltaic modules are operated in pairs;
each operating pair is operated out of phase with other operating pairs; and
each converter in a pair is operated 180 degrees out of phase with the other converter in the pair.

9. The photovoltaic system of claim 1, wherein:
the circuit card includes a negative connector and a positive connector;
each of the plurality of converters is independently electrically coupled to the positive connector via a corresponding fuse; and
in the event of a finite resistance short failure in one of the plurality of converters, the digital controller is configured to:
route all current from the plurality of photovoltaic cells through the one of the plurality of converters until the corresponding fuse opens; and
in response to opening the fuse, resume normal operation using at least some remaining ones of the plurality of converters.

10. The photovoltaic system of claim 1, wherein the digital controller is powered solely by energy generated by the photovoltaic module.

11. The photovoltaic system of claim 1, wherein:
the circuit card includes a positive connector electrically coupled to a row of the plurality of photovoltaic cells at the second end;
the plurality of converters are disposed on the circuit card in a line with a spacing of less than three millimeters between adjacent converters; and
each of the plurality of converters is disposed within a range of five to ten millimeters from the positive connector.

12. The photovoltaic system of claim 1, wherein each of the plurality of photovoltaic modules further includes an optical signal source communicatively coupled to the digital controller and mounted to the circuit card such that optical signals emitted by the optical signal source are visible from a front of each corresponding photovoltaic module.

13. The photovoltaic system of claim 12, wherein the digital controller is configured to operate the optical signal source to emit optical signals comprising status information.

14. The photovoltaic system of claim 13, wherein the status information comprises at least one of the following for the corresponding photovoltaic module: power and fault codes, a module serial ID, full fault logs, accumulated energy production, temperature, or a number of on/off cycles.

15. The photovoltaic system of claim 1, wherein each of the plurality of photovoltaic modules further comprises a radio frequency (RF)-emitting device communicatively coupled to the digital controller, the digital controller being configured to operate the RF-emitting device to transmit information to others of the plurality of photovoltaic modules and/or to a data collection device included in the photovoltaic system.

16. The photovoltaic system of claim 1, wherein each of the plurality of photovoltaic modules further comprises an undermount assembly within which the circuit card is disposed, the undermount assembly including a housing comprising:
  a main body; and
  a plurality of feet extending from the main body, the plurality of feet being substantially coplanar,
  wherein:
    the undermount assembly is mechanically coupled to a continuous backsheet of the corresponding photovoltaic module using an adhesive or tape disposed between the continuous backsheet and the plurality of feet; and
    the main body defines two slots through which two corresponding risers pass through the main body to electrically couple to the circuit card.

17. The photovoltaic system of claim 16, wherein:
  each undermount assembly further comprises a black cover thermally coupled to the circuit card;
  the black cover includes one or more protrusions exposed external to the undermount assembly that dissipate thermal energy away from the undermount assembly; and
  the black cover includes an edge in direct contact with or within 8 millimeters of a frame of the corresponding photovoltaic module that dissipates heat into the frame and away from the undermount assembly.

18. The photovoltaic system of claim 16, wherein:
  each of the two risers includes:
    a base defining a tapped hole; and
    a C-shaped end opposite the base, the C-shaped end including a top and a bottom, the top including an insulation-penetrating member and the bottom including a clamping member, the top being closer to the base than the bottom;
  the undermount assembly for each of the plurality of photovoltaic modules further comprises:
    two nests extending from a bottom surface of the main body, each of the two nests being integral to the main body or separately attached thereto, each of the two nests defining a slot in communication with a different one of the slots defined by the main body, each riser passing through a slot defined in a corresponding one of the nests and a corresponding slot defined in the main body;
    two caps, one each attached to a corresponding one of the two nests; and
    two screws, one each securing the circuit card to a corresponding one of the risers through the tapped hole defined in the base of the riser;
  the module-to-module bus comprises two wires, each having a cross-sectional area greater than or equal to 15 square millimeters and each having an insulating jacket;
  each of the two wires is disposed within the C-shaped end of each of the two risers without stripping the insulating jacket from the two wires during installation;
  the clamping member of each of the two risers being clamped during installation to clamp a corresponding one of the two wires against the insulation-penetrating member of each of the two risers such that the insulation-penetrating member penetrates the insulating jacket and electrically couples the corresponding wire to the corresponding riser;
  the C-shaped end of each of the two risers extends from a corresponding one of the two nests;
  after electrically coupling the corresponding wire to the corresponding riser, each of the two caps is attached to a corresponding one of the two nests to enclose the C-shaped end of each of the two risers and a portion of each of the two wires where the insulating jacket has been penetrated within a corresponding one of the nests and a corresponding one of the caps and to protect a corresponding electrical connection between the C-shaped end and the corresponding wire from environmental contaminants.

19. The photovoltaic system of claim 1, wherein each of the plurality of converters is operated with a duty cycle D in a range from $[(V_{out}-V_{in})/V_{out}-0.05]<D<0.75$, where $V_{out}$ and $V_{in}$ are an output voltage and an input voltage of the corresponding converter.

20. The photovoltaic system of claim 1, wherein each of the plurality of photovoltaic modules further comprises:
  measurement circuitry configured to measure an output current to the module-to-module bus or an input current from the module-to-module bus; and
  a digital controller configured to, based on the measurement, monitor an offset between the output current and the input current and/or to limit output current when the output current exceeds a preset limit.

21. A photovoltaic system comprising:
  a plurality of photovoltaic modules, each photovoltaic module defining a first end and a second end opposite the first end, wherein each photovoltaic module comprises:
    a plurality of photovoltaic cells, wherein energy generated by each photovoltaic cell has multiple paths through the plurality of photovoltaic cells to the second end; and
    a plurality of converters electrically coupled to the plurality of photovoltaic cells at the second end such that energy generated by each photovoltaic cell is receivable at any of the plurality of converters;
  a module-to-module bus electrically coupled to each of the plurality of photovoltaic modules such that the plurality of photovoltaic modules are electrically connected in parallel; and
  a plurality of inverters electrically coupled to the module-to-module bus such that energy generated by each photovoltaic module is receivable at any of the plurality of inverters;
  wherein:
    each of the plurality of photovoltaic modules further comprises:
      a circuit card mechanically coupled to the second end; and
      a digital controller disposed on the circuit card;
    the plurality of converters are disposed on the circuit card; and
    the digital controller of each of the photovoltaic modules is configured to:
      trickle charge current onto the module-to-module bus when a voltage on the module-to-module bus is less than a minimum threshold to determine whether a capacitive element is attached to the module-to-module bus;

in response to determining that the capacitive element is attached to the module-to-module bus, continue to trickle charge current onto the module-to-module bus until the voltage on the module-to-module bus rises above the minimum threshold;

close a protection relay when the voltage on the module-to-module bus rises above the minimum threshold to ensure zero current switching, the protection relay being electrically coupled between the module-to-module bus and an output bus of the circuit card, the output bus being electrically coupled to outputs of each of the plurality of converters;

operate the plurality of converters in a maximum current mode when the voltage on the module-to-module bus is between the minimum threshold and an intermediate threshold greater than the minimum threshold;

operate the plurality of converters in a constant voltage mode when the voltage on the module-to-module bus is between the intermediate threshold and a maximum threshold greater than the minimum threshold; and open the protection relay when the voltage on the module-to-module bus rises above the maximum threshold or falls below the minimum threshold.

22. The photovoltaic system of claim 21, wherein the module-to-module bus comprises a continuous and uninterrupted wire to which each of the plurality of photovoltaic modules is electrically coupled.

23. The photovoltaic system of claim 21, wherein one or more energy storage devices are coupled in parallel to the module-to-module bus.

24. The photovoltaic system of claim 23, wherein based on a DC setpoint and AC curtailment of each of the plurality of inverters and on a current state of charge of the one or more energy storage devices, current flows through the module-to-module bus and one or more of the plurality of inverters:

into the one or more energy storage devices from any or all phases of a multiphase AC power grid to which each of the plurality of inverters is coupled; or from the one or more energy storage devices into any or all phases of the multiphase AC power grid.

25. The photovoltaic system of claim 21, wherein each of the plurality of inverters is configured to be further coupled to any or all three phases of a three-phase AC power grid.

26. The photovoltaic system of claim 21, wherein the plurality of inverters comprise three inverters, and wherein each of the three inverters is further coupled to a different phase of a three-phase AC power grid using a Wye or Delta connection.

27. The photovoltaic system of claim 26, wherein each of the three inverters has a different DC setpoint and AC curtailment such that during operation current selectively flows:

to different phases of the three-phase AC power grid;

into one or more energy storage devices coupled in parallel to the module-to-module bus via the module-to-module bus; and/or from the one or more energy storage devices via the module-to-module bus.

28. The photovoltaic system of claim 26, wherein each of the three inverters has a different DC setpoint such that during operation current flows:

from one or more phases of the three-phase AC power grid through one or more of the plurality of inverters with a relatively high DC setpoint to the module-to-module bus; and from the module-to-module bus through one or more of the plurality of inverters with a relatively low DC setpoint to one or more other phases of the three-phase AC power grid.

29. The photovoltaic system of claim 21, wherein each of the plurality of inverters may be selectively disabled and enabled based on one or more criteria.

30. The photovoltaic system of claim 21, wherein the plurality of inverters are communicatively coupled together and are configured to communicate with each other to coordinate control of inverter-specific settings, the inverter-specific settings including a DC setpoint and AC curtailment of each of the plurality of inverters.

* * * * *